(12) United States Patent
Suzuki

(10) Patent No.: US 9,389,439 B2
(45) Date of Patent: Jul. 12, 2016

(54) SPATIAL LIGHT MODULATION ELEMENT AND EXPOSURE APPARATUS

(71) Applicant: Nikon Corporation, Chiyoda-ku (JP)

(72) Inventor: Yoshihiko Suzuki, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 14/186,359

(22) Filed: Feb. 21, 2014

(65) Prior Publication Data

US 2014/0168743 A1    Jun. 19, 2014

Related U.S. Application Data

(63) Continuation of application No. PCT/JP2012/005283, filed on Aug. 23, 2012.

(30) Foreign Application Priority Data

Aug. 25, 2011   (JP) .................................. 2011-184030

(51) Int. Cl.
*G02B 26/08* (2006.01)
*G02F 1/01* (2006.01)
(Continued)

(52) U.S. Cl.
CPC .............. *G02F 1/01* (2013.01); *G02B 26/0841* (2013.01); *G02B 26/101* (2013.01); *G03F 7/70075* (2013.01); *G03F 7/70116* (2013.01)

(58) Field of Classification Search
CPC .................................................. G02B 26/101
USPC ..................... 359/223.1, 224.1, 226.1, 226.2, 359/290–292, 298; 310/309
See application file for complete search history.

(56) References Cited

U.S. PATENT DOCUMENTS 5,508,841 A * 4/1996 Lin ........................ G02B 26/06
359/259
5,629,794 A    5/1997 Magel et al.
7,262,541 B2 * 8/2007 Xiaoyu .............. G02B 26/0841
310/309

(Continued)

FOREIGN PATENT DOCUMENTS

JP    07-027989    1/1995
JP    9-101467    4/1997

(Continued)

OTHER PUBLICATIONS

Notice of Reasons for Rejection from related Japanese Application No. 2013-529899, dated Oct. 28, 2014, 5 pages with English translation.

(Continued)

*Primary Examiner* — Tuyen Tra
(74) *Attorney, Agent, or Firm* — Klarquist Sparkman, LLP

(57) ABSTRACT

Provided is a spatial light modulation element comprising a substrate; a reflecting mirror that moves from an initial position relative to the substrate; an elastic member that exerts an elastic force in a direction causing the reflecting mirror to return to the original position; a support body that supports the elastic member; and an elastic support member that elastically supports the support body relative to the substrate. In the spatial light modulation element, the support body may be supported at a distance from a surface of the substrate. The spatial light modulation element may further comprise a connecting portion that connects the support body to the substrate such that the support body can move along a surface direction of the substrate.

9 Claims, 33 Drawing Sheets

(51) Int. Cl.
*G02B 26/10* (2006.01)
*G03F 7/20* (2006.01)

(56) References Cited

U.S. PATENT DOCUMENTS

| | | | | |
|---|---|---|---|---|
| 7,442,918 | B2* | 10/2008 | Sprague et al. | 250/234 |
| 7,475,993 | B2* | 1/2009 | Takeda | 353/31 |
| 8,149,489 | B2* | 4/2012 | Shimokawa et al. | 359/199.2 |
| 2007/0047046 | A1 | 3/2007 | Ji | |
| 2009/0185251 | A1* | 7/2009 | Chen | G02B 26/101 359/199.3 |

FOREIGN PATENT DOCUMENTS

| | | |
|---|---|---|
| JP | 2004-279881 | 10/2004 |
| JP | 2005-221903 | 8/2005 |
| JP | 2006-133412 | 5/2006 |
| JP | 2009-514031 | 4/2009 |
| JP | 2011-138046 | 7/2011 |
| KR | 10-0743315 | 7/2007 |
| WO | WO 2011/080883 | 7/2011 |

OTHER PUBLICATIONS

International Search Report and Written Opinion for related International Patent Application No. PCT/JP2012/005283, 15 pages, Nov. 27, 2012.
Office Action for related Korean Patent Application No. 10-2013-7034129, 9 pages, dated Dec. 23, 2014.
Final Notice of Preliminary Rejection (with English translation) from related Korean Application No. 10-2013-7034129, dated Jul. 29, 2015, 8 pages.
Notice of Final Rejection (with English translation) from related Korean Application No. 10-2013-7034129, dated Feb. 19, 2016, 10 pages.

* cited by examiner

SPATIAL LIGHT MODULATION ELEMENT AND EXPOSURE APPARATUS

The contents of the following Japanese and PCT patent applications are incorporated herein by reference:
No. JP2011-184030 filed on Aug. 25, 2011, and
No. PCT/JP2012/005283 filed on Aug. 23, 2012.

BACKGROUND

1. Technical Field

The present invention relates to a spatial light modulation element and an exposure apparatus.

2. Related Art

There is a known spatial light modulator that forms a pattern in a radiated light beam by reflecting incident light, as described in Japanese Patent Application Publication No. H09-101467.

The components forming the spatial light modulator have their own individual temperature characteristics. Therefore, until the overall temperature stabilizes, the characteristics change in a complicated manner and the control accuracy is reduced, thereby reducing the effective throughput of the equipment using the spatial light modulator.

SUMMARY

According to a first aspect of the present invention, provided is a spatial light modulation element comprising a substrate; a reflecting mirror that moves from an initial position relative to the substrate; an elastic member that exerts an elastic force in a direction causing the reflecting mirror to return to the original position; a support body that supports the elastic member; and an elastic support member that elastically supports the support body relative to the substrate.

According to a second aspect of the present invention, provided is a spatial light modulator comprising a plurality of the spatial light modulation elements according to the first aspect.

According to a third aspect of the present invention, provided is an exposure apparatus comprising the spatial light modulation element according to the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
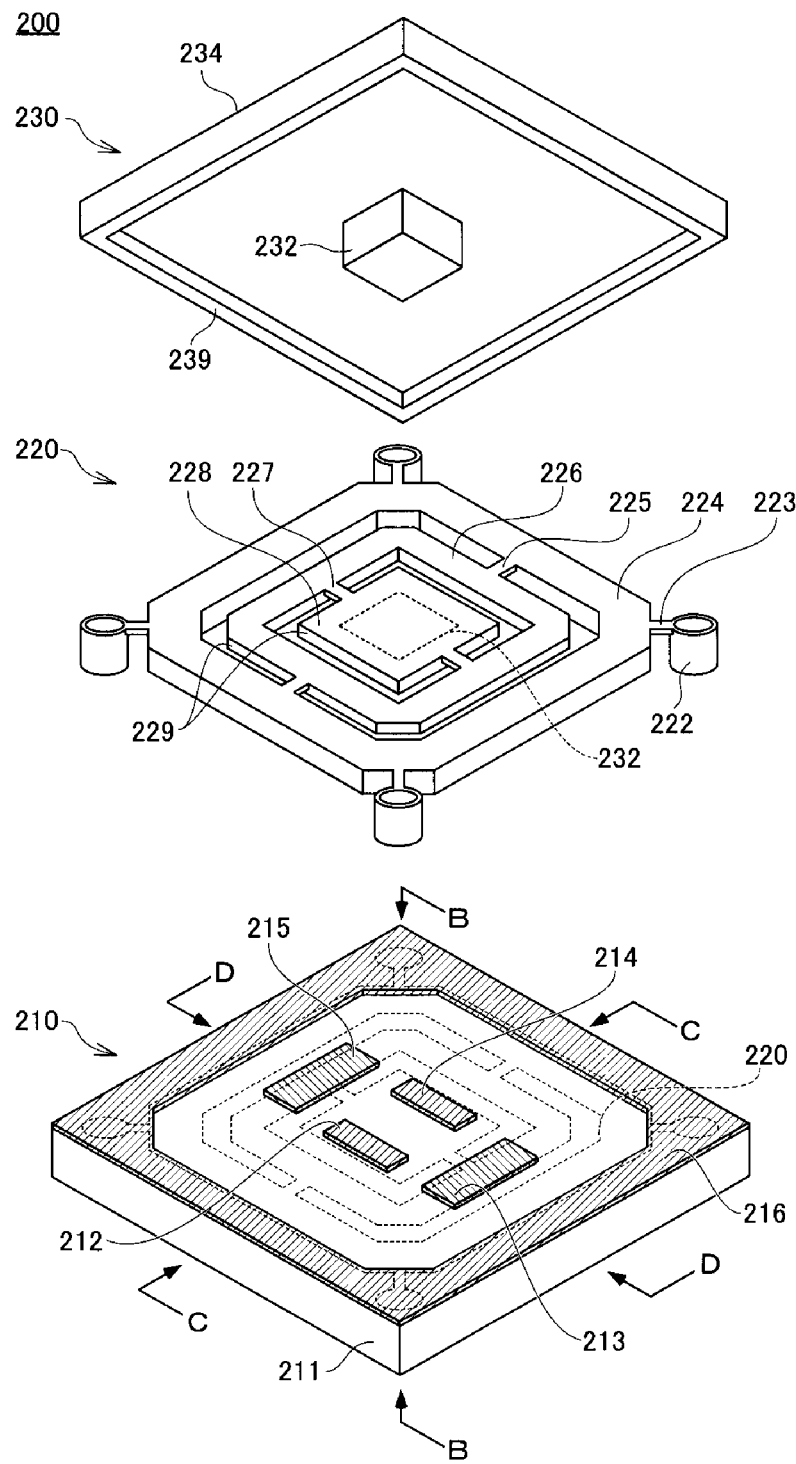
FIG. 1 is a schematic exploded perspective view of the spatial light modulation element 200.

FIG. 1 is a schematic exploded perspective view of a spatial light modulation element 200. The spatial light modulation element 200 includes a circuit portion 210, a support section 220, and a reflecting portion 230 that are layered sequentially.

The circuit portion 210 includes a substrate 211 and electrodes 212, 213, 214, 215, and 216. The substrate 211 includes a CMOS circuit, and applies a drive voltage to each of the electrodes 212, 213, 214, 215, and 216.

Two pairs of electrodes 212, 213, 214, and 215 are formed as flat electrodes on the surface of the substrate 211, and are positioned to face each other. These two pairs of electrodes 212, 213, 214, and 215 are supplied with a drive voltage from the CMOS circuit of the substrate 211. The remaining electrode 216 covers the entire edge portion of the substrate 211, and is connected to a reference voltage, e.g. a ground voltage.

In the drawings, the shape of the support section 220, which is the top layer, is shown by dotted lines on the surface of the substrate 211. In this way, the positional relationship between each portion of the support section 220 and the electrodes 212, 213, 214, 215, and 216 can be seen.

The support section 220 includes lower posts 222, a base frame 224, a pivoting frame 226, and a pivoting board 228. The four lower posts 222 are arranged respectively at the four corners of the substrate 211, and are secured upright on the surface of the substrate 211.

The base frame 224 (support body) connects the four corners at the top end of the lower posts 222, using flexures 223 that are connecting members (elastic support members) formed integrally with the lower posts 222 and the base frame 224. The height of the lower posts 222 is greater than the thickness of the base frame 224.

The pivoting frame 226 is supported inside the base frame 224 by a pair of torsion shafts 225 (elastic members) supported by the base frame 224. The pair of torsion shafts 225 have the same bend strength as each other. The pivoting board 228 is supported inside the pivoting frame 226 by a pair of torsion shafts 227 arranged in a direction intersecting the direction of the torsion shafts 225. The pair of torsion shafts 227 have the same bend strength as each other.

When the support section 220 described above is secured to the top surface of the circuit portion 210, the pivoting frame 226 is opposite the electrodes 213 and 215, as shown by the dotted lines on the surface of the substrate 211 in FIG. 1. Accordingly, when the drive voltage is applied to one of the electrodes 213 and 215, electrostatic force acts between the pivoting frame 226 and this one of the electrodes 213 and 215. As a result, the pivoting frame 226 pivots relative to the substrate 211, with the torsion shafts 225 as the pivoting axis.

In the same manner, the pivoting board 228 is opposite the electrodes 212 and 214. Accordingly, when the drive voltage is applied to one of the electrodes 212 and 214, electrostatic force acts between the pivoting board 228 and this one of the electrodes 212 and 214. As a result, the pivoting board 228 pivots relative to the substrate 211, with the torsion shafts 227 as the pivoting axis.

The reflecting portion 230 includes a reflecting mirror 234 and an upper post 232. The reflecting mirror 234 is a smooth flat plane facing upward in FIG. 1. The upper post 232 protrudes downward in FIG. 1 from the bottom surface of the reflecting mirror 234, and is coupled to the substantial center of the pivoting board 228 indicated by the dotted line in FIG. 1.

As a result, the reflecting mirror 234 is formed integrally with the pivoting board 228, while being distanced above the support section 220. Accordingly, when the pivoting board 228 pivots toward the substrate 211, the reflecting mirror 234 pivots together with the pivoting board 228.

Figure 2:
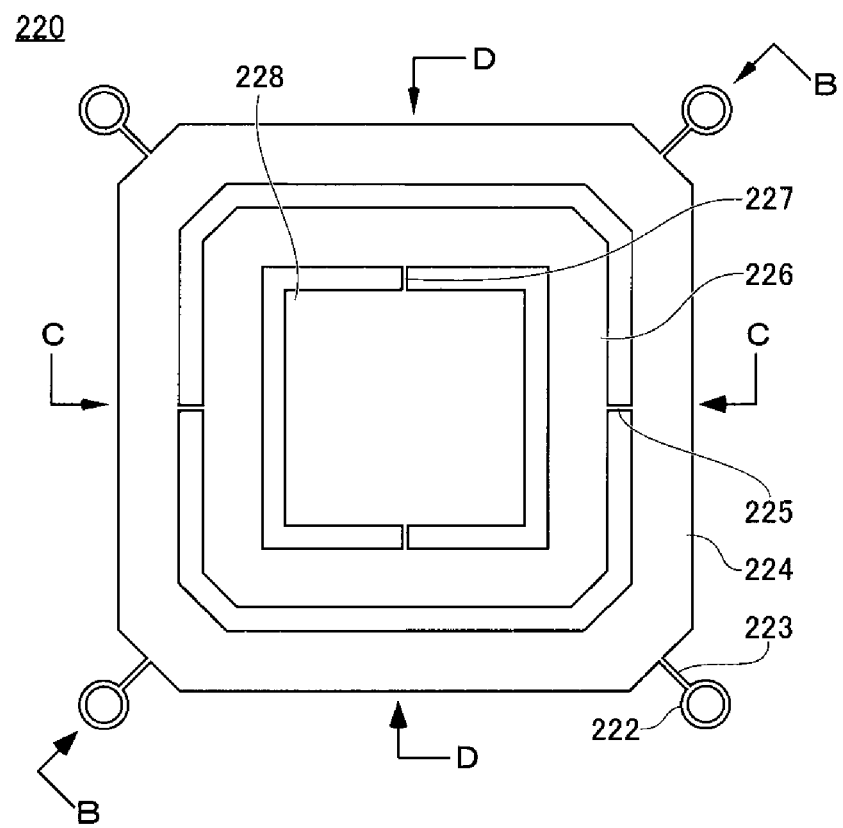
FIG. 2 is a planar view of the support section 220.

FIG. 2 is a planar view of the support section 220. Components that are the same as those in FIG. 1 are given the same reference numerals, and redundant descriptions are omitted.

The rectangular base frame 224 is connected to the lower posts 222 at the four corners by the flexures 223. Accordingly, the position of the base frame 224 is set inside the lower posts 222.

The torsion shafts 225 connecting the pivoting frame 226 to the base frame 224 are finer and thinner than the base frame 224 and the pivoting frame 226. Accordingly, when the electrostatic force acts between the pivoting frame 226 and the electrodes 213 and 215, the torsion shafts 225 deform in a twisting manner to enable the pivoting frame 226 to pivot relative to the base frame 224.

The torsion shafts 227 connecting the pivoting board 228 to the pivoting frame 226 are finer and thinner than the pivoting frame 226 and the pivoting board 228. Accordingly, when the electrostatic force acts between the pivoting board 228 and the electrodes 212 and 214, the torsion shafts 227 deform in a twisting manner to enable the pivoting board 228 to pivot relative to the pivoting frame 226.

The torsion shafts 225 serving as the pivoting axis for the pivoting frame 226 and the torsion shafts 227 serving as the pivoting axis for the pivoting board 228 are arranged such that their directions are orthogonal to each other. Accordingly, by combining the pivoting of the pivoting frame 226 and the pivoting of the pivoting board 228, the pivoting direction of the pivoting board 228 can be selected freely. In the example of FIG. 1, the torsion shafts 225 and torsion shafts 227 are oriented orthogonally to each other, but the orientation directions only need to be intersecting.

Figure 3:
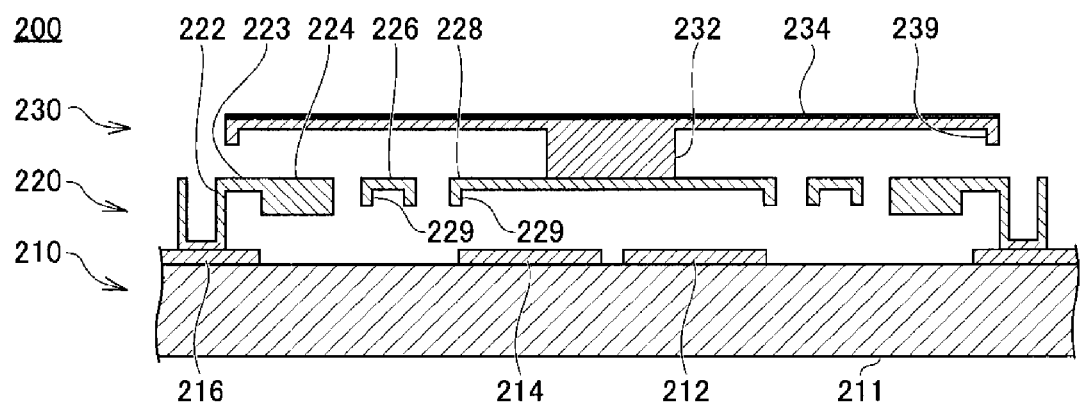
FIG. 3 is a cross-sectional view of the spatial light modulation element 200.

FIG. 3 is a schematic cross-sectional view of the spatial light modulation element 200, and shows the cross section in the direction of the arrows B shown in FIGS. 1 and 2. Components that are the same as those in FIGS. 1 and 2 are given the same reference numerals, and redundant descriptions are omitted.

As shown in the cross section of FIG. 3, the bottom end of the lower post 222 is secured to the electrode 216 on the substrate 211. Furthermore, the top end of the lower post 222 is connected to the base frame 224 by the flexure 223.

As a result, the support section 220 is secured on the substrate 211, and the base frame 224, pivoting frame 226, and pivoting board 228 are each positionally secured at a distance from the surface of the substrate 211. Furthermore, the electrodes 212 and 214 are opposite the bottom surface of the pivoting board 228.

The edges of each of the pivoting frame 226, the pivoting board 228, and the reflecting mirror 234 are provided with ribs 229 and 239 that protrude downward. As a result, the pivoting frame 226, the pivoting board 228, and the reflecting mirror 234 each have high bend strength.

The base frame 224 is thicker than both the pivoting frame 226 and the pivoting board 228. Accordingly, the base frame 224 has relatively higher strength than the pivoting frame 226 and the pivoting board 228, and is less likely to deform. Accordingly, when the flexure 223 deforms, the base frame 224 deforms only slightly.

In contrast to this, the flexure 223 is finer and thinner than both the lower post 222 and the base frame 224, and therefore has relatively lower strength. Accordingly, when the relative positions of the lower post 222 and the base frame 224 change in a direction of the surface of the substrate 211, the flexure 223 deforms easily and movement of the base frame 224 relative to the substrate 211 is allowed.

When the base frame 224 moves, the flexure 223 deforms within a range allowed by its elastic deformation ability. Accordingly, when the force acting on the base frame 224 is removed, the elastic force of the flexure 223 causes the base frame 224 to return to its initial position at the center of the lower post 222.

Figure 4:
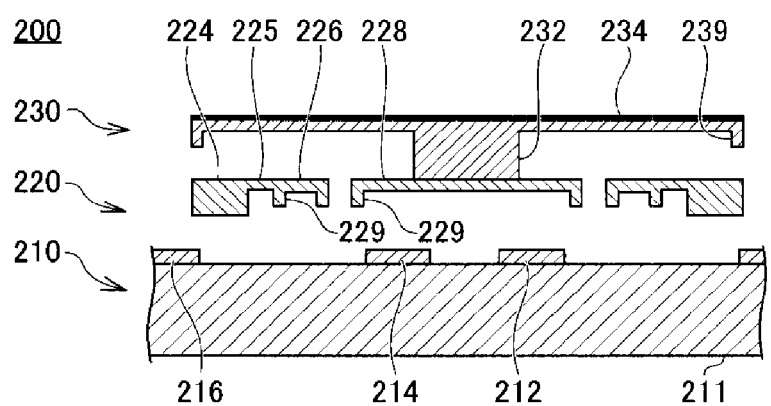
FIG. 4 is a cross-sectional view of the spatial light modulation element 200.

FIG. 4 is a schematic cross-sectional view of the spatial light modulation element 200, and shows the cross section in the direction of the arrows C shown in FIGS. 1 and 2. Components that are the same as those in FIGS. 1 and 2 are given the same reference numerals, and redundant descriptions are omitted.

The base frame 224, the pivoting frame 226, and the pivoting board 228 are distanced from the substrate 211. The electrodes 212 and 214 are arranged opposite the ends of the pivoting board 228 in FIG. 4. The torsion shafts 227 supporting the pivoting board 228 are arranged perpendicular to the plane of FIG. 4, and therefore the electrostatic force caused by the drive voltage applied to the electrodes 212 and 214 acts efficiently on the pivoting board 228.

Furthermore, in this cross section, it can be seen that the base frame 224 and the pivoting frame 226 are connected by a torsion shaft 225. As described above, the pivoting frame 226 has a rib 229, and therefore has higher bend strength that the torsion shaft 225.

The base frame 224 is thicker than both the torsion shaft 225 and the pivoting frame 226, and therefore has relatively higher bend strength. Accordingly, when the electrostatic force acts on the pivoting frame 226, the torsion shaft 225 deforms in a twisting manner while the base frame 224 and the pivoting frame 226 do not deform, thereby allowing the pivoting frame 226 to pivot.

It should be noted that, when the pivoting frame 226 pivots, the torsion shaft 225 deforms within the range allowed by its elastic deformation ability. Accordingly, when the electrostatic force acting on the pivoting frame 226 is removed, the elastic force of the torsion shaft 225 causes the pivoting frame 226 to return to its original position parallel to the substrate 211.

Figure 5:
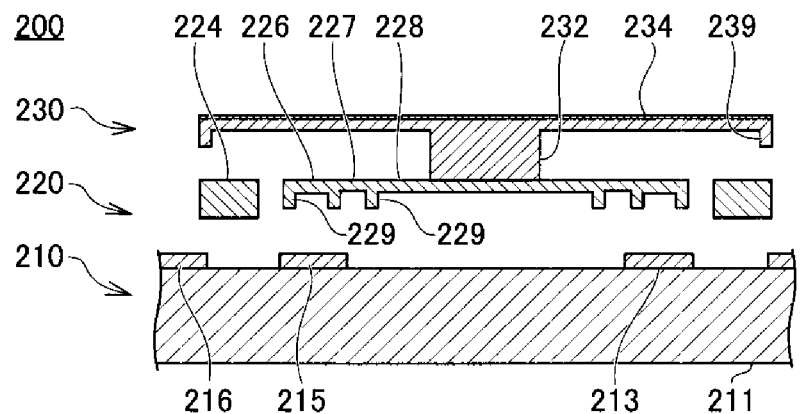
FIG. 5 is a cross-sectional view of the spatial light modulation element 200.

FIG. 5 is a schematic cross-sectional view of the spatial light modulation element 200, and shows the cross section in the direction of the arrows D shown in FIGS. 1 and 2. Components that are the same as those in FIGS. 1 and 2 are given the same reference numerals, and redundant descriptions are omitted.

The base frame 224, the pivoting frame 226, and the pivoting board 228 are distanced from the substrate 211. The electrodes 213 and 215 are positioned opposite the ends of the pivoting frame 226 in FIG. 5. The torsion shafts 225 supporting the pivoting frame 226 are perpendicular to the plane of FIG. 5, and therefore the electrostatic force applied to the electrodes 213 and 215 acts efficiently on the pivoting frame 226.

Furthermore, in this cross section, it can be seen that the pivoting frame 226 and the pivoting board 228 are connected by a torsion shaft 227. As described above, the pivoting frame 226 and the pivoting board 228 have ribs 229, and therefore have higher bend strength that the torsion shaft 227. Accordingly, when the electrostatic force acts on the pivoting board 228, the torsion shaft 227 deforms in a twisting manner while the pivoting frame 226 and the pivoting board 228 do not deform, thereby allowing the pivoting board 228 to pivot.

It should be noted that, when the pivoting board 228 pivots, the torsion shaft 227 deforms within the range allowed by its elastic deformation ability. Accordingly, when the electrostatic force acting on the pivoting board 228 is removed, the elastic force of the torsion shaft 227 causes the pivoting board 228 to return to its original position parallel to the substrate 211.

Figure 6:
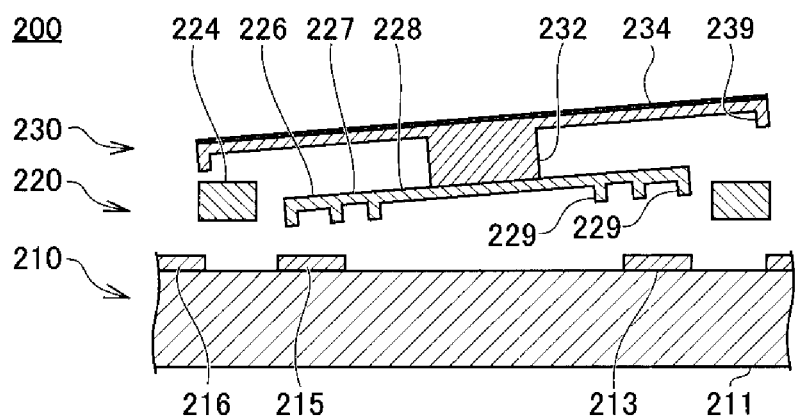
FIG. 6 is a cross-sectional view of the spatial light modulation element 200.

FIG. 6 shows a cross section of the spatial light modulation element 200, which is the same cross section as shown in FIG. 5. Components that are the same as those in FIG. 5 are given the same reference numerals, and redundant descriptions are omitted.

In the cross section of FIG. 6, the electrostatic force acts between the pivoting frame 226 and one of the electrodes 213 and 215, thereby causing the pivoting frame 226 to be inclined relative to the substrate 211. As a result, the pivoting board 228 becomes inclined along with the pivoting frame 226. Furthermore, the reflecting mirror 234 connected to the pivoting board 228 by the upper post 232 becomes inclined relative to the substrate 211, along with the pivoting board 228. In this way, in the spatial light modulation element 200, the inclination of the reflecting mirror 234 can be changed by controlling the drive voltage applied to the electrodes 212, 213, 214, and 215.

The elastic force of the torsion shaft 225 acts on the inclined pivoting frame 226, with a bias toward the initial position parallel to the substrate 211. Accordingly, when the electrostatic force acting on the pivoting frame 226 is removed, the pivoting frame 226 returns to its initial position parallel to the substrate 211. Furthermore, this motion of the pivoting frame 226 causes the reflecting portion 230 to return to its original position. In this way, the torsion shafts 225 and 227 act as elastic members.

Figure 7:
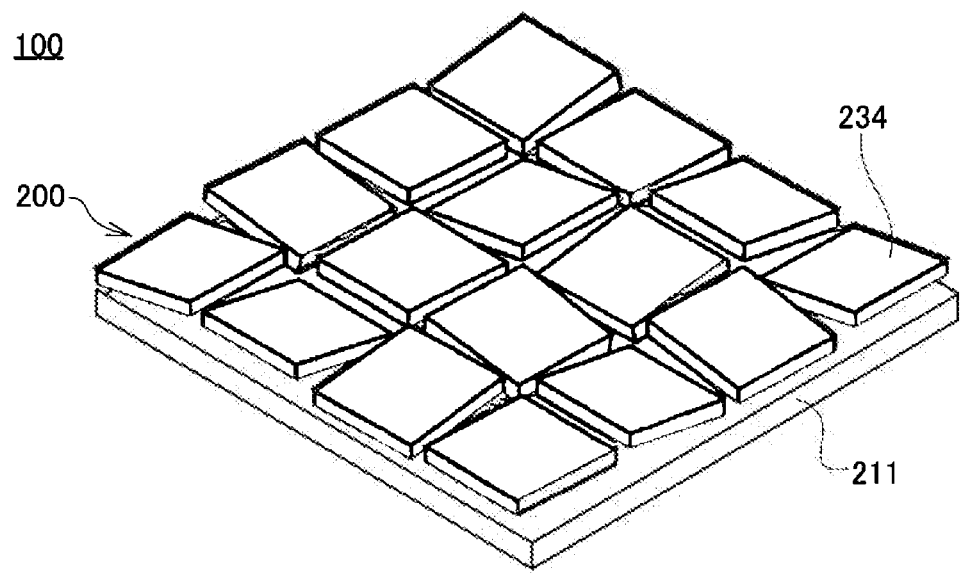
FIG. 7 is a schematic perspective view of the outside of the spatial light modulator 100.

FIG. 7 is a schematic perspective view of the outside of the spatial light modulator 100 including the spatial light modulation element 200. Components that are the same as those in FIGS. 1 to 6 are given the same reference numerals, and redundant descriptions are omitted.

The spatial light modulator 100 includes a single substrate 211 and a plurality of reflecting mirrors 234 arranged on the substrate 211. Each reflecting mirror 234 is provided with a support section 220 and electrodes 212, 213, 214, 215, and 216 formed on the substrate 211, and a plurality of the spatial light modulation elements 200 are arranged in a matrix on the substrate 211.

In this way, the inclination of each reflecting mirror 234 can be changed independently, by independently controlling the drive voltage applied to each spatial light modulation element 200. Accordingly, by using the spatial light modulator 100 to reflect light from a light source having a uniform distribution, for example, a desired radiation pattern can be formed. Furthermore, by using the spatial light modulator 100 to reflect light from a light source with a non-uniform distribution, uniform radiated light can be formed. Accordingly, the spatial light modulator 100 can be used to form a variable light source, an exposure apparatus, an image display device, an optical switch, or the like.

Figure 8:
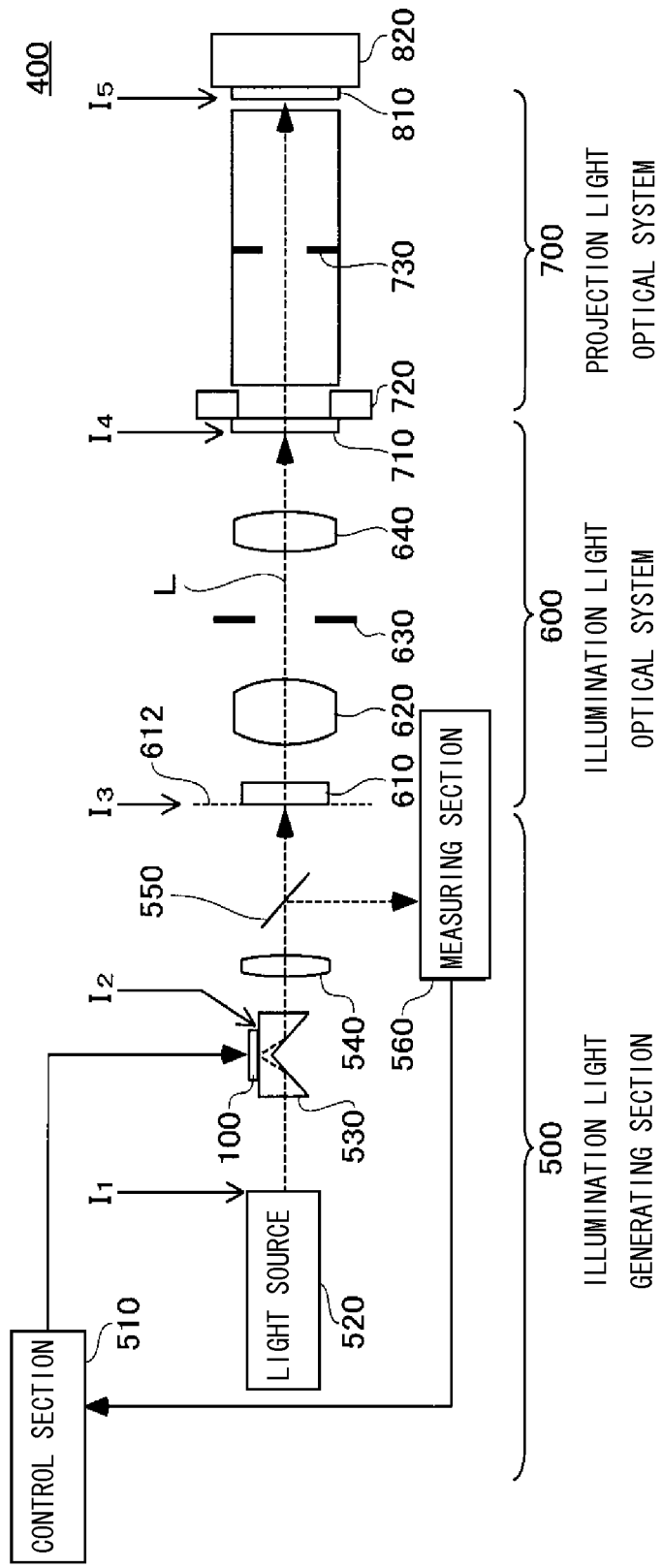
FIG. 8 is a schematic view of the exposure apparatus 400.

FIG. 8 is a schematic view of an exposure apparatus 400 including the spatial light modulator 100. This exposure apparatus 400 includes the spatial light modulator 100 and, when performing a light source mask optimization, can input radiation light having a desired intensity distribution to an illumination optical system 600. Specifically, the exposure apparatus 400 includes an illumination light generating section 500, the illumination optical system 600, and a projection optical system 700.

The illumination light generating section 500 includes a control section 510, a light source 520, the spatial light modulator 100, a prism 530, an imaging optical system 540, a beam splitter 550, and a measuring section 560. The light source 520 generates the radiation light L. The radiation light L generated by the light source 520 has an intensity distribution corresponding to characteristics of the light emitting mechanism of the light source 520. Therefore, the radiation light L includes a raw image $I_1$ in a cross-sectional plane orthogonal to the optical path of the radiation light L.

The radiation light L emitted from the light source 520 is incident to the prism 530. The prism 530 guides the radiation light L to the spatial light modulator 100, and then emits the light to the outside. The spatial light modulator 100 modulates the radiation light L incident thereto under the control of the control section 510. The configuration and operation of the spatial light modulator 100 has already been described above.

The radiation light L emitted from the prism 530 through the spatial light modulator 100 passes through the imaging optical system 540 and is then incident to the illumination optical system 600. The imaging optical system 540 forms an illumination light image $I_3$ in an input surface 612 of the illumination optical system 600.

The beam splitter 550 is arranged in the optical path of the radiation light L, between the imaging optical system 540 and the illumination optical system. The beam splitter 550 splits a portion of the radiation light L prior to being incident to the illumination optical system 600, and guides this split portion to the measuring section 560.

The measuring section 560 measures the image of the radiation light L at a position optically conjugate with the input surface 612 of the illumination optical system 600. In this way, the measuring section 560 measures the image that is the same as the illumination light image $I_3$ incident to the illumination optical system 600. Accordingly, the control section 510 can perform feedback control of the spatial light modulator 100, by referencing the illumination light image $I_3$ measured by the measuring section 560.

The illumination optical system 600 includes a fly eye lens 610, a condenser optical system 620, a field stop 630, and an imaging optical system 640. The emission end of the illumination optical system 600 has a mask stage 720 holding a mask 710 arranged thereon.

The fly eye lens 610 includes a large number of lens elements arranged in parallel with high density, and forms a two-dimensional light source including the same number of illumination light images 13 as the number of lens components on the rear focal surface. The condenser optical system 620 focuses the radiation light L emitted from the fly eye lens 610 and illuminates the field stop 630 in a superimposed manner.

The radiation light L that has passed through the field stop 630 forms an emission light image $I_4$, which is an image of the aperture of the field stop 630, on the pattern surface of the mask 710 due to the imaging optical system 640. In this way, the illumination optical system 600 can perform Kohler illumination with the emission light image $I_4$ on the pattern surface of the mask 710 arranged on the emission end thereof.

The intensity distribution formed at the incident end of the fly eye lens 610, which is also the input surface 612 of the illumination optical system 600, exhibits a high correlation with a global intensity distribution of the overall two-dimensional light source formed on the emission end of the fly eye lens 610. Accordingly, the illumination light image $I_3$ input to the illumination optical system 600 by the illumination light generating section 500 is also exhibited in the emission light image $I_4$, which has the intensity distribution of the radiation light L radiated by the illumination optical system 600 onto the mask 710.

The projection optical system 700 is arranged directly behind the mask stage 720, and includes an aperture stop 730. The aperture stop 730 is arranged at a position that is optically conjugate with the emission end of the fly eye lens 610 of the illumination optical system 600. A substrate stage 820 that holds a substrate 810 having a photosensitive material applied thereto is arranged at the emission end of the projection optical system 700.

The mask 710 held by the mask stage 720 includes a mask pattern formed by a region that reflects or passes the radiation light L emitted by the illumination optical system 600 and a region that absorbs this radiation light L. Accordingly, by radiating the emission light image $I_4$ onto the mask 710, the projection light image $I_5$ is generated by the interaction between the intensity distribution of the emission light image $I_4$ itself and the mask pattern of the mask 710. The projection light image $I_5$ is projected onto the photosensitive material of the substrate 810, and forms a sacrificial layer having the desired pattern on the surface of the substrate 810.

In FIG. 8, the optical path of the radiation light L is a straight line, but the exposure apparatus 400 can be miniaturized by bending the optical path of the radiation light L. Furthermore, FIG. 8 shows the radiation light L passing through the mask 710, but a reflective mask 710 may be used instead.

Figure 9:
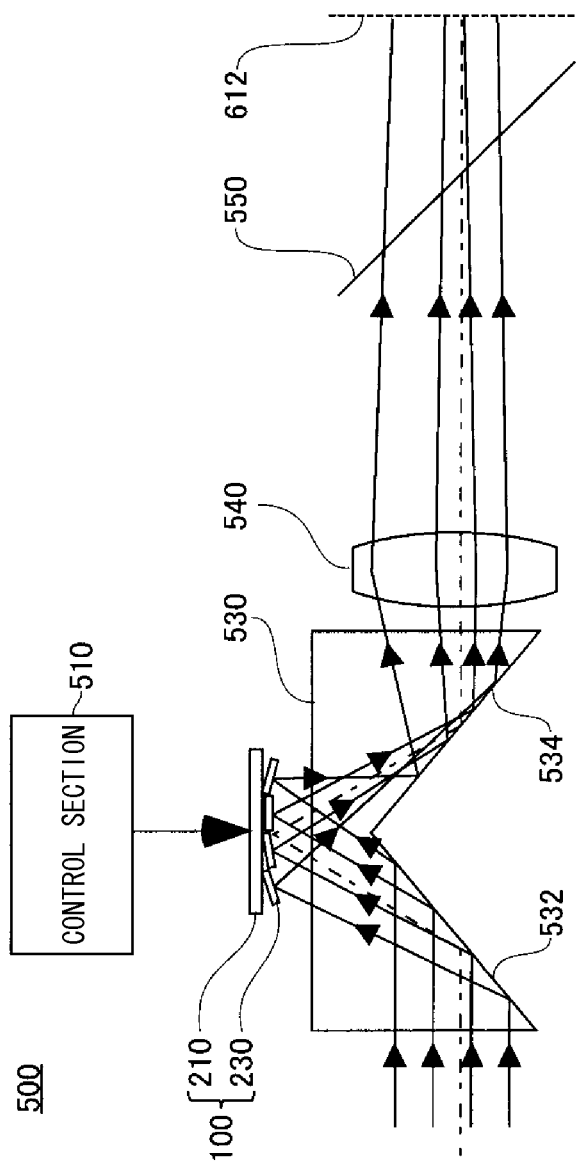
FIG. 9 is a schematic view of the illumination light generating section 500.

FIG. 9 is a partial enlarged view of the illumination light generating section 500, and shows the role of the spatial light modulator 100 in the exposure apparatus 400. The prism 530 includes a pair of reflective surfaces 532 and 534. The radiation light L incident to the prism 530 is radiated toward the spatial light modulator 100 by the one reflective surface 532.

As already described above, the spatial light modulator 100 includes a plurality of reflecting portions 230 that can pivot independently. Accordingly, by having the control section 510 control the spatial light modulator 100, the desired light source image $I_2$ can be formed.

The light source image $I_2$ emitted from the spatial light modulator 100 is reflected by the other reflective surface 534 of the prism 530, and is emitted from the end of the prism 530 on the right side of FIG. 9. The light source image $I_2$ emitted from the prism 530 forms the illumination light image $I_3$ on the input surface 612 of the illumination optical system 600, due to the imaging optical system 540.

Figure 10:
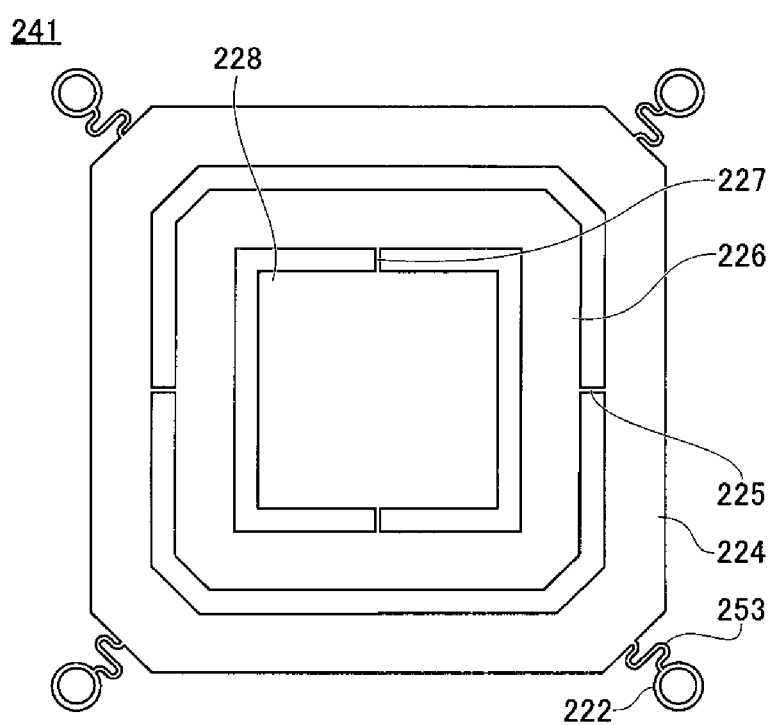
FIG. 10 is a planar view of the support section 241.

FIG. 10 is a planar view of a support section 241 having a different shape. Components that are the same as those in FIG. 2 are given the same reference numerals, and redundant descriptions are omitted.

The support section 241 differs from the support section 220 with respect to the shape of the flexures 253 connecting the lower posts 222 to the base frame 224. Specifically, the flexures 223 in the support section 220 are straight lines, while the flexures 253 in the support section 241 are formed as repeating curves.

As a result, the elasticity of the flexures 253 is reduced, and the flexures 253 become more deformed when the same load is applied. Accordingly, the movement of the lower posts 222 formed integrally with the substrate 211 and the movement or deformation of the base frame 224 can be more effectively stopped.

The strength of the flexures 253 may be greater than the strength of the torsion shafts 225 and 227. As a result, the effect of the elastic deformation of the flexures 253 on the pivoting of the reflecting portion 230 can be restricted.

Figure 11:
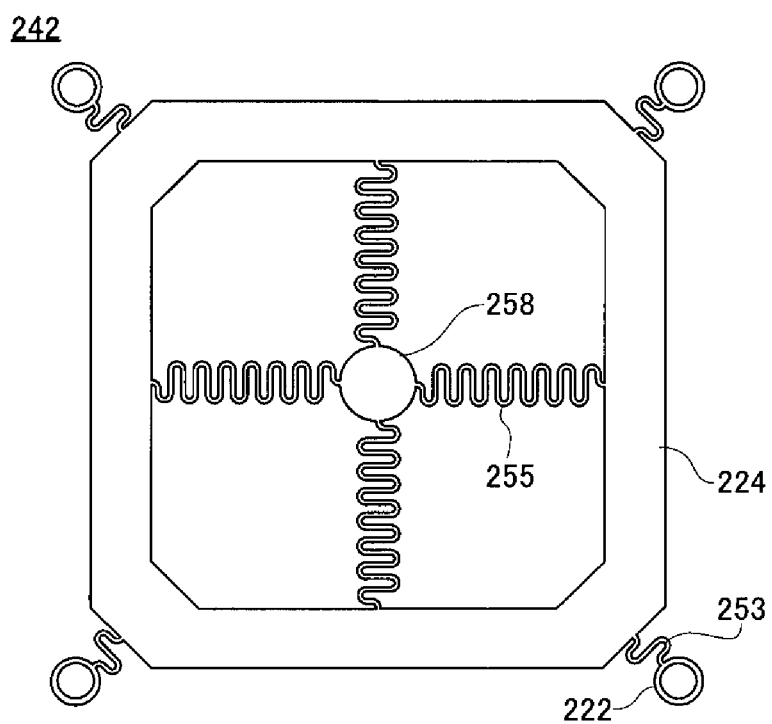
FIG. 11 is a planar view of the support section 242.

FIG. 11 is a planar view of a support section 242 having yet another shape. Components that are the same as those in FIG. 10 are given the same reference numerals, and redundant descriptions are omitted.

The support section 242 differs from the support sections 220 and 241 by including a smaller pivoting board 258. The pivoting frame 226 is removed, and the pivoting board 258 is connected to the center portion of each edge of the base frame 224 by long flexures 255. The base frame 224 may be connected to the lower posts 222 by flexures 253 having bending shapes, in the same manner as the support section 241.

With the configuration described above, the pivoting board 258 can easily pivot relative to the base frame 224 using the support section 242. The support section 242 does not include a surface acted upon by the electrostatic force of the electrodes 212, 213, 214, and 215 on the substrate 211. Accordingly, in the spatial light modulation element 200 including the support section 242, the reflecting mirror 234 is made to pivot by an electrostatic force between the back surface of the reflecting mirror 234 mounted on the pivoting board 258 and the electrodes 212, 213, 214, and 215.

Figure 12:
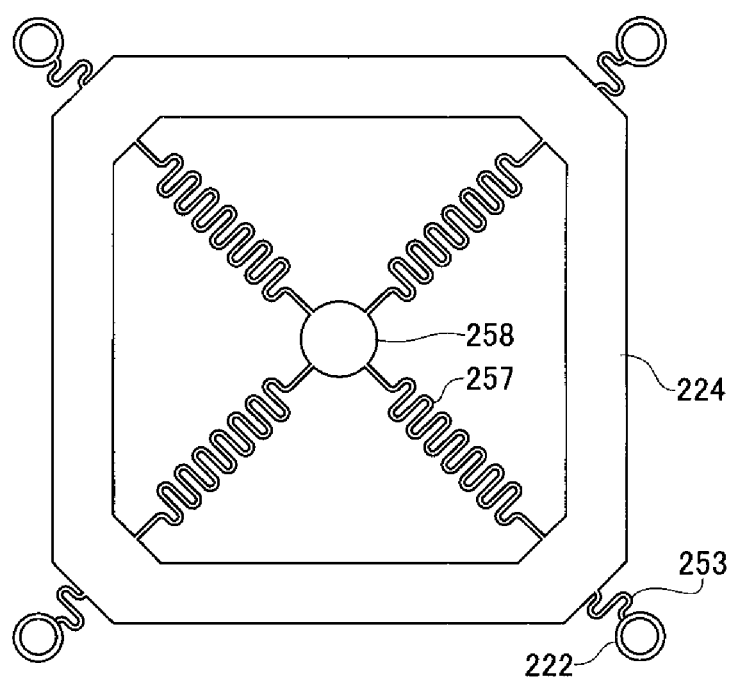
FIG. 12 is a planar view of the support section 243.

FIG. 12 is a planar view of a support section 243. Components that are the same as those in FIG. 11 are given the same reference numerals, and redundant descriptions are omitted.

The support section 243 differs from the support section 242 in that the long flexures 257 that connect the pivoting board 258 inside the base frame 224 are arranged extending to the corners of the base frame 224. As a result, the long flexures 257 become longer, which results in significantly lower elasticity and allows for easier pivoting of the pivoting board 228.

In a spatial light modulation element 200 including this support section 243, the support section 243 does not include a surface acted upon by the electrostatic force of the electrodes 212, 213, 214, and 215 on the substrate 211. Accordingly, in the spatial light modulation element 200 including the support section 243, the reflecting mirror 234 is made to pivot by an electrostatic force between the back surface of the reflecting mirror 234 mounted on the pivoting board 258 and the electrodes 212, 213, 214, and 215.

Figure 13:
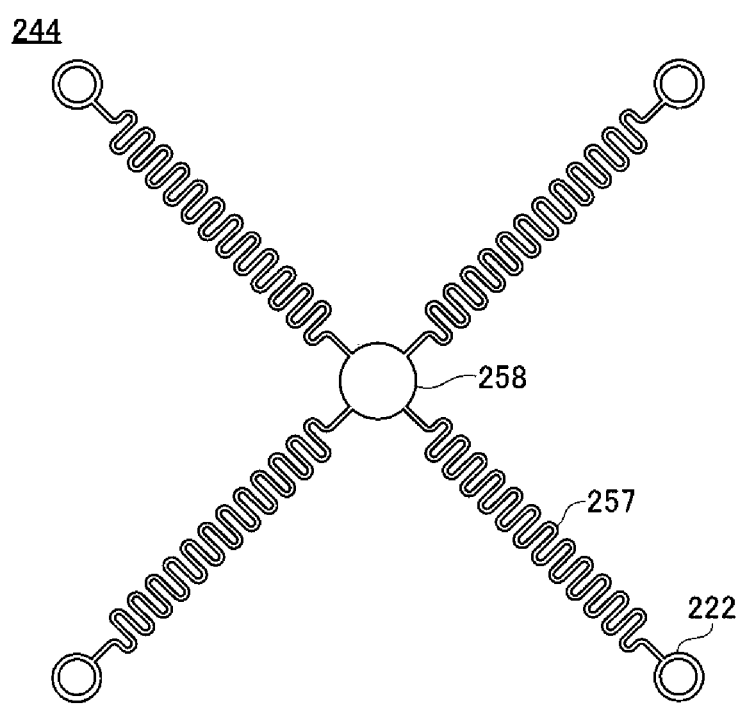
FIG. 13 is a planar view of the support section 244.

FIG. 13 is a planar view of a support section 244 manufactured for the purpose of comparison. Components that are the same as those in FIG. 11 are given the same reference numerals, and redundant descriptions are omitted.

The support section 244 does not include the base frame 224, and the lower posts 222 and pivoting board 258 are connected directly to each other by the long flexures 257. Accordingly, in a spatial light modulation element 200 including the support section 244, the electrostatic force between the back surface of the reflecting mirror 234 mounted on the pivoting board 258 and the electrodes 212, 213, 214, and 215 acts to pivot the reflecting mirror 234.

Figure 14:
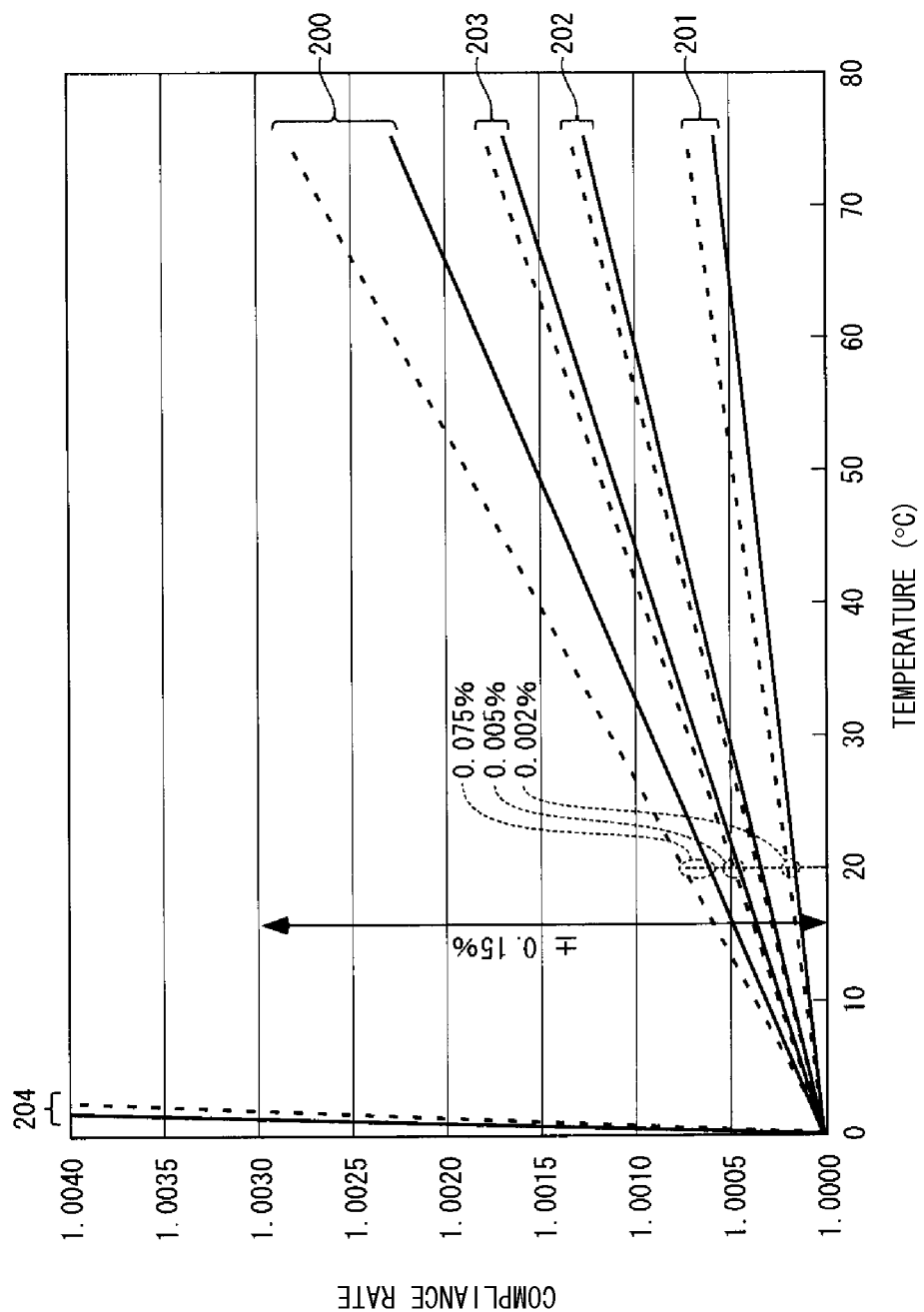
FIG. 14 is a graph showing the temperature characteristics of the spatial light modulation elements 200, 201, 202, and 203.

FIG. 14 is a graph showing the relationship between the compliance rate and the temperature of spatial light modulation elements 200, 201, 202, and 203 including the support sections 220, 241, 242, and 243 shown in FIGS. 2, 10, 11, and 12. In FIG. 14, the characteristics of the spatial light modulation element 204 including the support section 244 shown in FIG. 13 are included for comparison.

In FIG. 14, for each of the spatial light modulation elements 200, 201, 202, and 203, the dotted lines represent cases in which the support sections 220, 241, 242, 243, and 244 are selectively heated, and the solid lines represent cases in which the spatial light modulation elements 200, 201, 202, 203, and 204 are heated overall. As shown in FIG. 14, the spatial light modulation elements 200, 201, 202, and 203 including the support sections 220, 241, 242, and 243 with the base frame 224 supported by the flexures 223 and 253 exhibited little divergence in the temperature characteristics between cases of partial heating (dotted lines) and cases of overall heating (solid lines).

Specifically, for the spatial light modulation elements 200, 201, 202, and 203 including the support sections 220, 241, and 243 with the base frame 224 supported by the flexures 223 and 253, at a temperature of 20° C., for example, the differences between the compliance rates for the cases of partial heating and the compliance rates for the cases of overall heating were well under the acceptable range of ±0.15%, as shown in FIG. 14. However, in the spatial light modulation element 204 including the support section 244 that does not have the base frame 224, although the solid line and the dotted line are horizontally near each other in the graph, the slopes of the straight lines representing the characterizes are steep. Therefore, the difference between the compliance rate for the case of partial heating and the compliance rate for the case of overall heating is incredibly large.

Accordingly, a device that includes the spatial light modulation elements 200, 201, 202, or 203 can use the spatial light modulation element immediately after startup, without experiencing a decrease in control during an initial time when the temperatures of the components are unstable. As a result, the throughput of a spatial light modulator 100 using the spatial light modulation elements 200, 201, 202, or 203 and the throughput of devices using this spatial light modulator 100 can be improved.

Furthermore, the spatial light modulation elements 200, 201, and 203 including the support sections 220, 241, and 243 have gentle compliance rate temperature characteristics, and can restrict the decrease in controllability caused by temperature change. Accordingly, devices including the spatial light modulation element 200 can operate stably over long periods of time.

FIGS. 15 to 31 are each a cross-sectional view of a step in a process for manufacturing the spatial light modulation element 200 shown in FIGS. 1 to 6. The steps of manufacturing the circuit portion 210 in FIGS. 15 and 16, the steps of manufacturing the support section 220 in FIGS. 17 to 23, and the steps of manufacturing the reflecting portion 230 in FIGS. 24 to 32 are all shown using the same cross section as in FIG. 3.

Since a manufacturing process is shown in FIGS. 15 to 31, there are cases where corresponding components in the spatial light modulation element 200 will have different shapes or states. Therefore, in FIGS. 15 to 31, a unique reference numeral is given to each component, and when a portion or all of a component is completed, the relationship of this component to the components of the spatial light modulation element 200 is explained.

Figure 15:
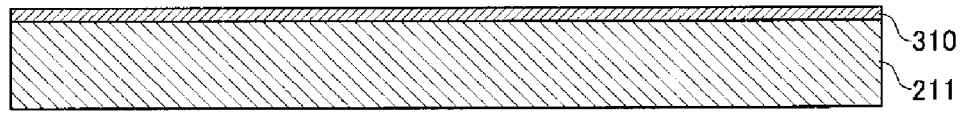
FIG. 15 is a cross-sectional view of a step in the process for manufacturing the spatial light modulation element 200.

First, as shown in FIG. 15, the substrate 211 forming the spatial light modulation element 200 is prepared, and the conductive layer 310 that will become the electrodes 212, 213, 214, 215, and 216 is formed over the entire surface of the substrate 211. The substrate 211 can be a silicon monocrystalline substrate, or can be another widely used component having a flat surface, such as a compound semiconductor substrate or a ceramic substrate. It is assumed that circuitry for providing drive power, a CMOS circuit, and the like are formed in advance in the substrate 211.

The conductive layer 310 can be formed by a TiAl alloy, for example. Another metal such as aluminum or copper may be used. The method for depositing the conductive layer 310 can be selected from among physical vapor deposition, chemical vapor deposition, gold impregnation, or the like, according to the material used for the conductive layer 310.

Figure 16:
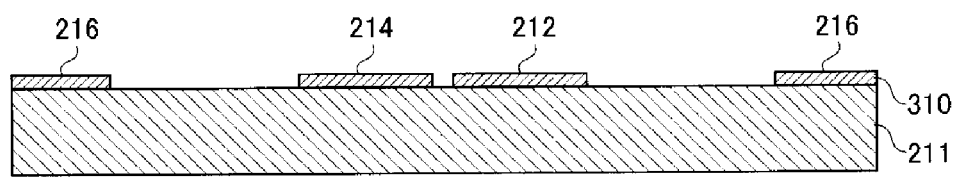
FIG. 16 is a cross-sectional view of a step following the step of FIG. 15 in the process for manufacturing the spatial light modulation element 200.

Next, as shown in FIG. 16, the conductive layer 310 is patterned. In this way, the electrodes 212, 214, and 216 of the spatial light modulation element 200 are formed. The surface of the conductive layer 310 that is patterned as the electrodes 212, 214, and 216 may further be covered with an insulating layer. In this way, shorts in the electrodes 212, 213, 214, and 215 can be prevented.

A nitride or oxide of the material used for the substrate 211 can be used as the material for the insulating layer, for example. Furthermore, the insulating layer may be a porous body with a high dielectric constant. The method for depositing the insulating material layer can be selected from among any type of physical vapor deposition or chemical vapor deposition, depending on the material.

Figure 17:
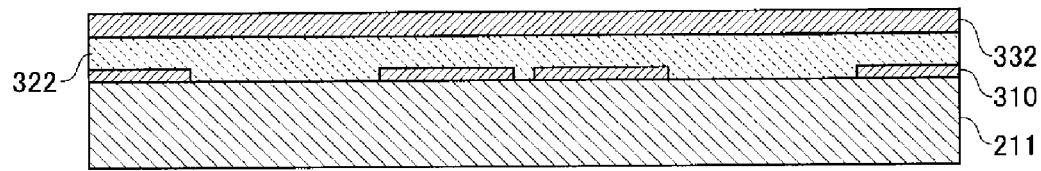
FIG. 17 is a cross-sectional view of a step following the step of FIG. 16 in the process for manufacturing the spatial light modulation element 200.

Next, as shown in FIG. 17, the surface of the substrate 211 and the surface of the conductive layer 310 are made flat by the sacrificial layer 322, and then the metal layer 332 is formed. The sacrificial layer 322 is formed by silicon oxide, for example. The metal layer 332 can be formed of a TiAl alloy, for example, using physical vapor deposition, chemical vapor deposition, gold impregnation, or the like.

Figure 18:
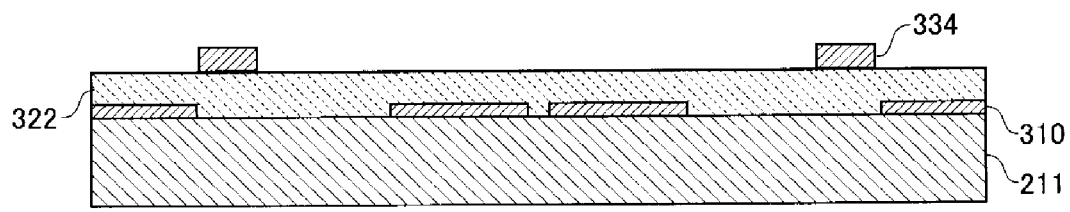
FIG. 18 is a cross-sectional view of a step following the step of FIG. 17 in the process for manufacturing the spatial light modulation element 200.

Next, as shown in FIG. 18, the metal layer 332 is patterned using dry etching or the like. In this way, the metal pattern 334 serving as a portion of the base frame 224 in the spatial light modulation element 200 is formed.

Next, in order to form the support section 220 of the spatial light modulation element 200, a sacrificial layer serving as the deposition base is formed. It should be noted that the patterning using photolithography is limited to a flat surface. Therefore, when forming a stereoscopic structure, a plurality of sacrificial layers are formed in stages to create a stereoscopic deposition base.

Figure 19:
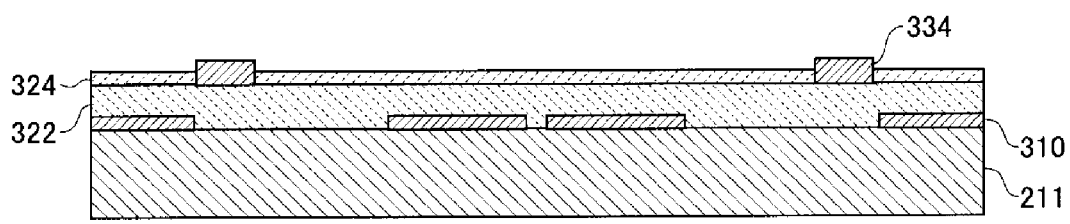
FIG. 19 is a cross-sectional view of a step following the step of FIG. 18 in the process for manufacturing the spatial light modulation element 200.

First, as shown in FIG. 19, the sacrificial layer 324 is further deposited around the metal pattern 334, thereby adjusting the height. The material and deposition method for the sacrificial layer 324 may be the same as for the initial sacrificial layer 322.

Figure 20:
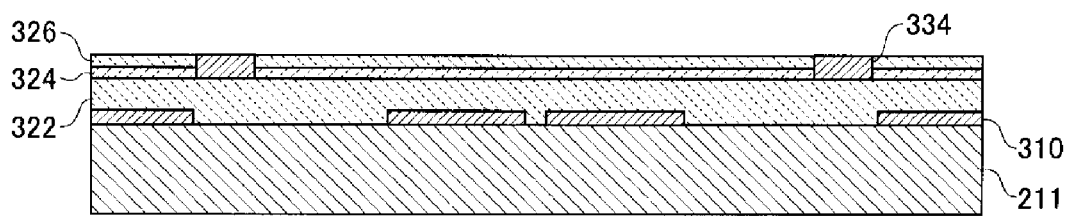
FIG. 20 is a cross-sectional view of a step following the step of FIG. 19 in the process for manufacturing the spatial light modulation element 200.

Next, as shown in FIG. 20, another sacrificial layer 326 provided for patterning is layered on the existing sacrificial layer 324, thereby achieving deposition with the same height as the metal pattern 334. For example, the sacrificial layer 324 formed by silicon oxide can be patterned using an HF vapor technique.

Figure 21:
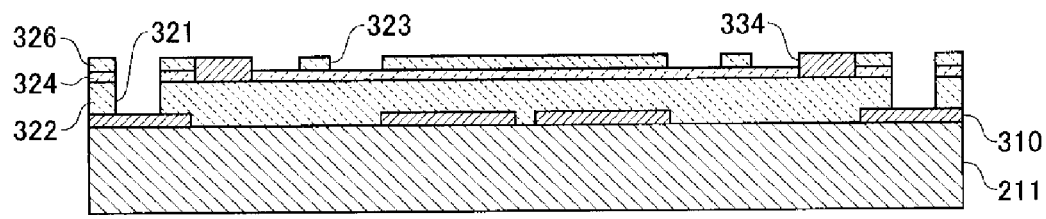
FIG. 21 is a cross-sectional view of a step following the step of FIG. 20 in the process for manufacturing the spatial light modulation element 200.

Next, as shown in FIG. 21, the two sacrificial layers 324 and 326 are patterned together, thereby forming the contact hole 321. The contact hole 321 is formed by dry etching, for example, and reaches the conductive layer 310 directly above the substrate 211. In this way, the deposition base having a stereoscopic shape is formed on the substrate 211.

Figure 22:
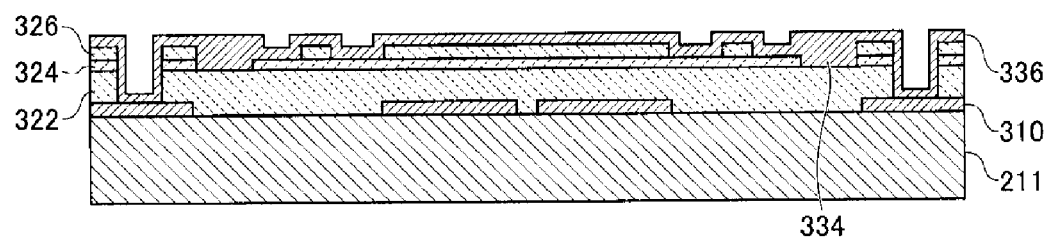
FIG. 22 is a cross-sectional view of a step following the step of FIG. 21 in the process for manufacturing the spatial light modulation element 200.

Next, as shown in FIG. 22, the metal layer 336 is formed over the entire surface of the conductive layer 310, the sacrificial layer 324, and the sacrificial layer 326. The metal layer 336 can be formed by a TiAl alloy, for example, and the deposition method can be selected from among physical vapor deposition, chemical vapor deposition, gold impregnation, or the like.

Figure 23:
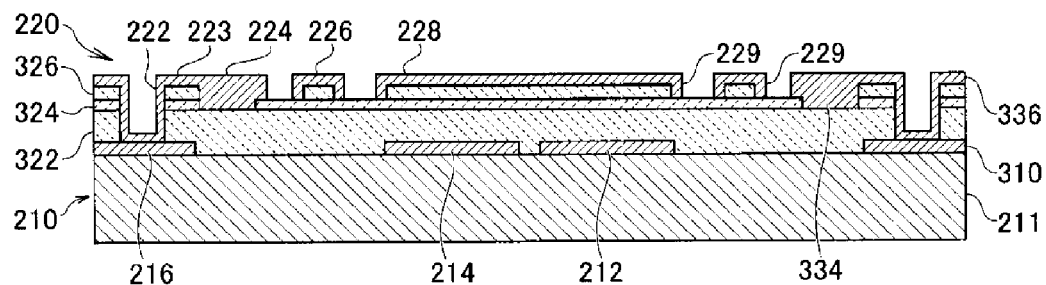
FIG. 23 is a cross-sectional view of a step following the step of FIG. 22 in the process for manufacturing the spatial light modulation element 200.

Furthermore, as shown in FIG. 23, the metal layer 336 is patterned to form the support section 220. The metal layer 336 can be patterned using dry etching, for example.

As can be seen by referencing FIG. 3, the lower posts 222, the flexures 223, the base frame 224, the pivoting frame 226, and the pivoting board 228 are formed sequentially in the metal layer 336, in the stated order beginning from the outside. Furthermore, by forming the metal layer 336 on the stereoscopic deposition base, the ribs 229 protruding downward are formed on the edges of the pivoting frame 226 and the pivoting board 228. As a result, the pivoting frame 226 and the pivoting board 228 have a high cross-sectional two-dimensional moment.

Figure 24:
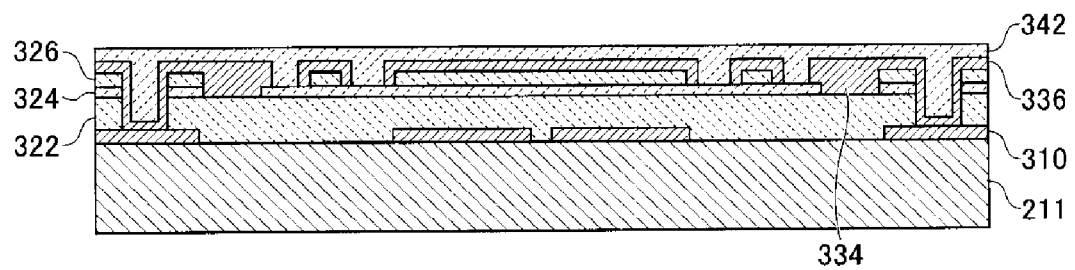
FIG. 24 is a cross-sectional view of a step following the step of FIG. 23 in the process for manufacturing the spatial light modulation element 200.
Figure 25:
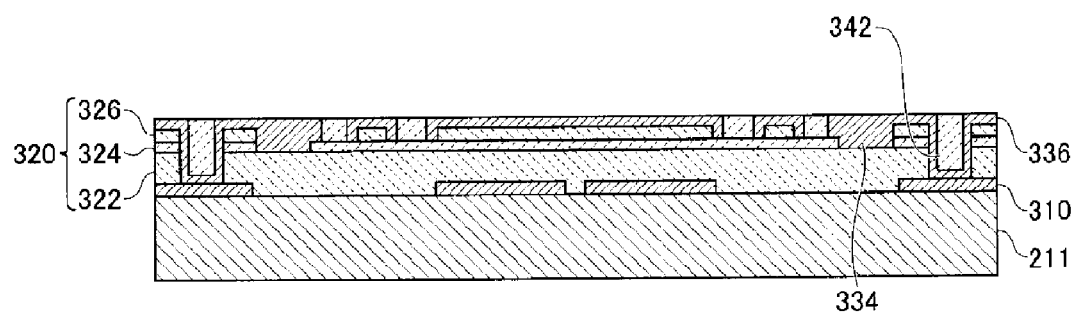
FIG. 25 is a cross-sectional view of a step following the step of FIG. 24 in the process for manufacturing the spatial light modulation element 200.

Next, as shown in FIG. 24, the surface of the metal layer 336 and the surface of the sacrificial layer 326 exposed therebetween are flattened by a new sacrificial layer 342. Furthermore, as shown in FIG. 25, the surface of the sacrificial layer 342 is trimmed such that the sacrificial layer 342 and the top surface of the metal layer 336 form a flat surface.

In this way, the structure existing below the support section 220 is protected, and the deposition base forming the reflecting portion 230 is formed. In order to simplify the drawings, the following description refers to the sacrificial layers 322, 324, and 326 collectively as the sacrificial layer 320.

Figure 26:
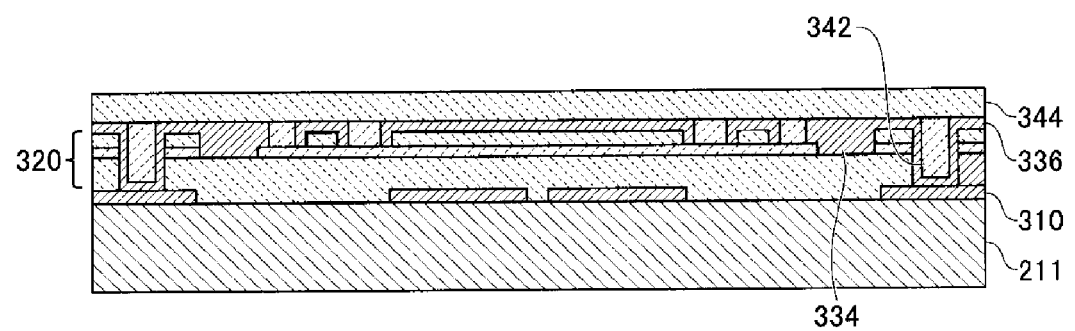
FIG. 26 is a cross-sectional view of a step following the step of FIG. 25 in the process for manufacturing the spatial light modulation element 200.
Figure 27:
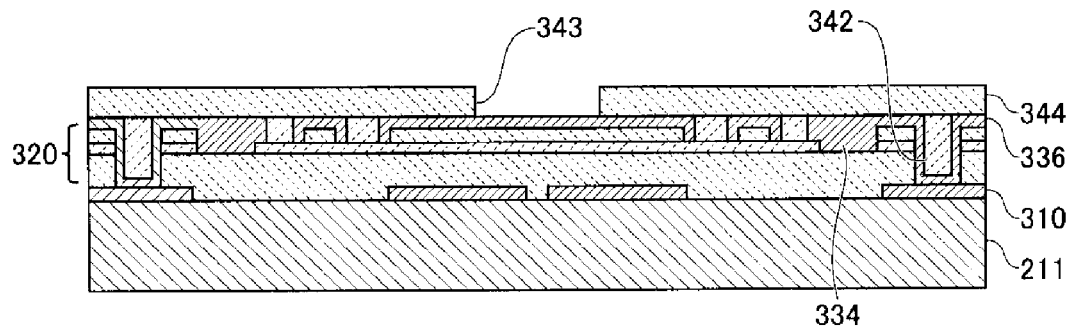
FIG. 27 is a cross-sectional view of a step following the step of FIG. 26 in the process for manufacturing the spatial light modulation element 200.

Next, a two-layer structure including sacrificial layers 344 and 346 is again formed to serve as a deposition base. First, as shown in FIG. 26, the sacrificial layer 344 serving as the bottom layer of this two-layer structure is formed on the surfaces of the sacrificial layer 342 and the metal layer 336. Furthermore, as shown in FIG. 27, the sacrificial layer 344 is patterned to form the hole pattern 343 reaching the metal layer 336 in the substantial center of the device.

Figure 28:
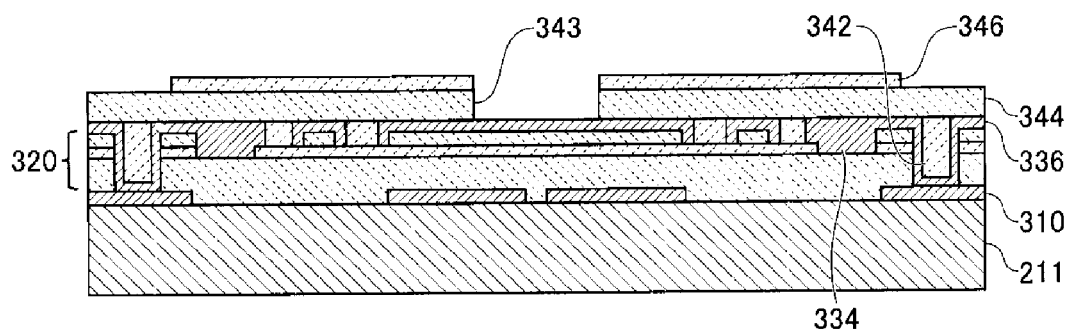
FIG. 28 is a cross-sectional view of a step following the step of FIG. 27 in the process for manufacturing the spatial light modulation element 200.

Next, as shown in FIG. 28, the sacrificial layer 346 serving as the second layer of the two-layer structure is deposited, and includes a hole pattern aligned with the hole pattern of the sacrificial layer 344 and a unique trimming pattern that removes the edges thereof. In this way, the substrate base of the reflecting portion 230 is formed. The material, deposition method, and patterning method for the sacrificial layers 344 and 346 can be the same as used for the sacrificial layer 320.

Figure 29:
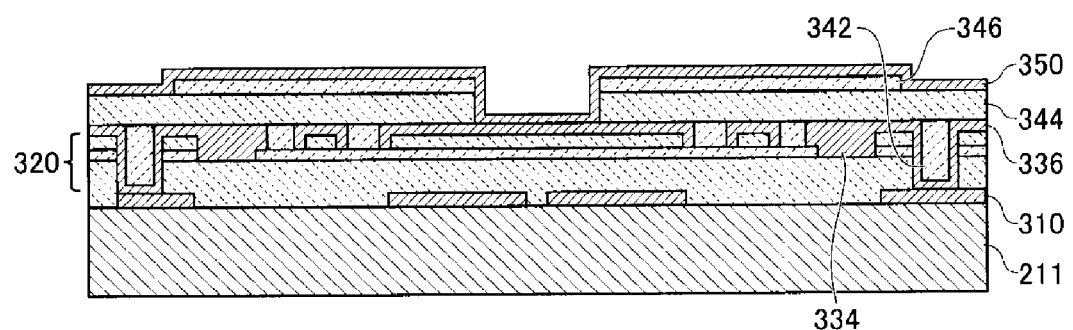
FIG. 29 is a cross-sectional view of a step following the step of FIG. 28 in the process for manufacturing the spatial light modulation element 200.

Next, as shown in FIG. 29, the metal layer 350 is formed on the surfaces of the sacrificial layers 344 and 346. The metal layer 350 can be formed of a TiAl alloy, for example. The deposition method can be selected from among physical vapor deposition, chemical vapor deposition, gold impregnation, or the like.

Figure 30:
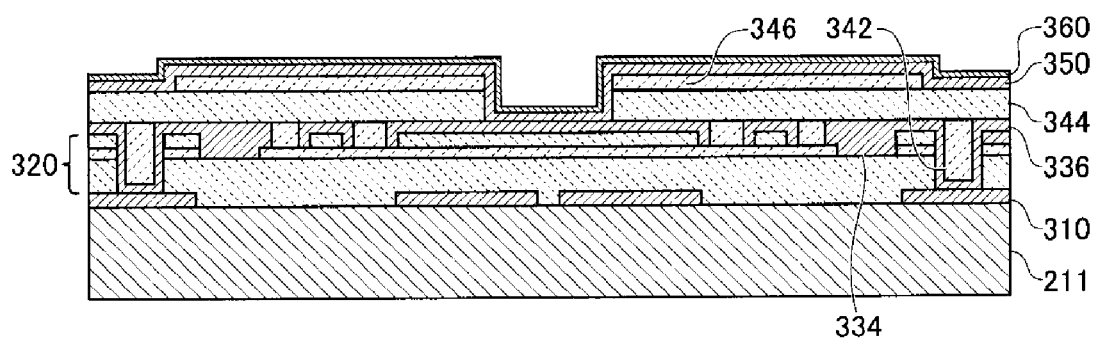
FIG. 30 is a cross-sectional view of a step following the step of FIG. 29 in the process for manufacturing the spatial light modulation element 200.

Next, as shown in FIG. 30, the reflective layer 360 is deposited on the metal layer 350. The reflective layer 360 is formed by a material with high reflectance, such as an aluminum thin film.

The reflective layer 360 has a surface that reflects incident light in the spatial light modulation element 200. Accordingly, prior to forming the reflective layer 360, the surface of the metal layer 350 serving as the base may be undergo chemical mechanical polishing to become a mirror surface. Furthermore, the surface of the reflective layer 360 itself may undergo chemical mechanical polishing to become a mirror surface. Furthermore, the metal layer 350 and the reflective layer 360 may both undergo chemical mechanical polishing.

When aluminum or the like is used as the material of the reflective layer 360, in order to prevent change in the surface state due to oxidation or the like, a protective film may be further layered on the surface of the reflective layer 360. The protective film can be a dense thin film made of inorganic material such as alumina. The protective layer is obviously transparent with respect to the light reflected by the reflective layer 360.

Figure 31:
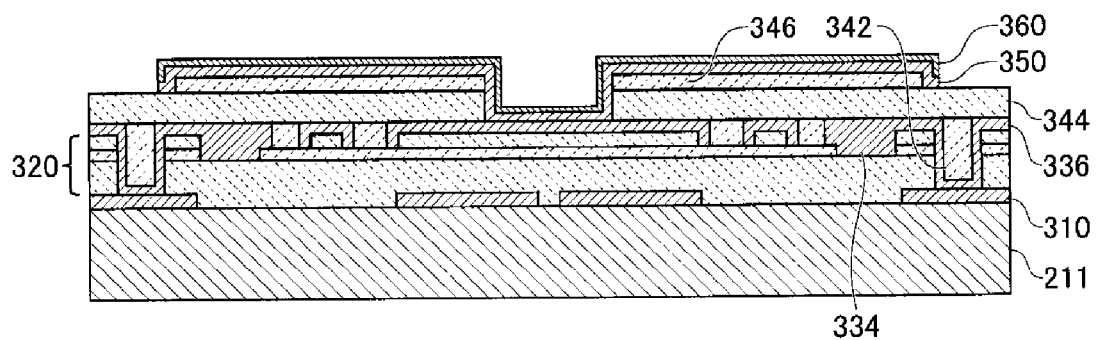
FIG. 31 is a cross-sectional view of a step following the step of FIG. 30 in the process for manufacturing the spatial light modulation element 200.
Figure 32:
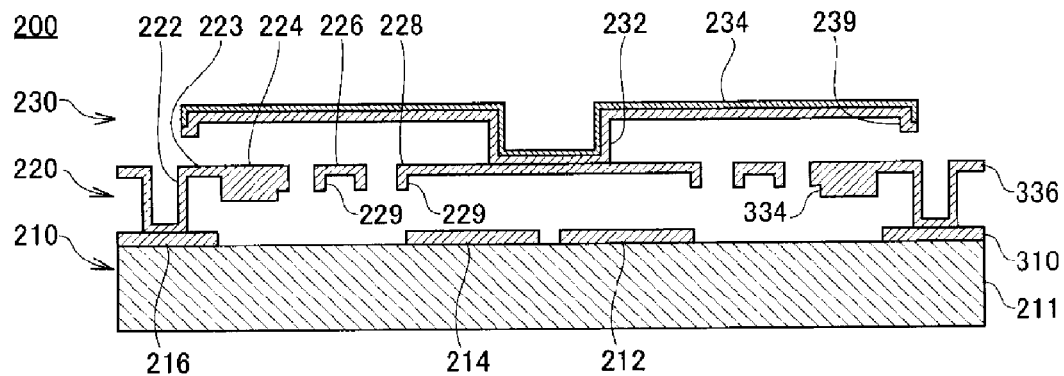
FIG. 32 is a cross-sectional view of a step following the step of FIG. 31 in the process for manufacturing the spatial light modulation element 200.

Next, as shown in FIG. 31, the edge portions of the metal layer 350 and reflective layer 360 in FIG. 31 are trimmed. As a result, the reflecting portion 230 having the rib protruding downward in FIG. 31 is formed. Finally, as shown in FIG. 32, the sacrificial layers 320, 342, 344, and 346 are removed.

The surface of the sacrificial layer 344 is exposed at both ends of the reflective layer 360. The sacrificial layer 326 remaining within the metal layer 336 is layered on the sacrificial layer 324, and therefore these layers are continuous. The sacrificial layer 324 is layered on the sacrificial layer 322, and therefore these layers are continuous. In this way, the sacrificial layer 324 is formed in a continuous manner, and can therefore be removed all at once using the HF vapor technique.

When the sacrificial layer 324 is removed, the spatial light modulation element 200 is completed. In other words, the electrodes 212, 214, and 216 formed by the conductive layer 310 are arranged on the surface of the substrate 211, thereby forming the circuit portion 210.

Furthermore, the metal layers 332 and 336 form the support section 220. In the support section 220, the flexures 223 and the torsion shafts 225 and 227 are thin, while the base frame 224 is thick. The pivoting frame 226 and the pivoting board 228 each include a rib 229.

Yet further, the reflecting portion 230 is connected to the pivoting board 228 by the upper post 232. The reflecting portion 230 has the reflecting mirror 234 with high reflectance formed by the reflective layer 360.

A portion similar to a flange extending horizontally might occur at the bottom end of the rib 229. This is the fin remaining when the metal layer 336 is patterned, and is not formed intentionally. However, this portion does not reduce the strength of the pivoting frame 226 or the pivoting board 228 and may actually improve the strength, and so this portion may be left intact.

In the example described above, a single spatial light modulation element 200 is manufactured. However, the spatial light modulator 100 can also be manufactured by forming a plurality of spatial light modulation elements 200 on a single substrate 211 en bloc.

Figure 33:
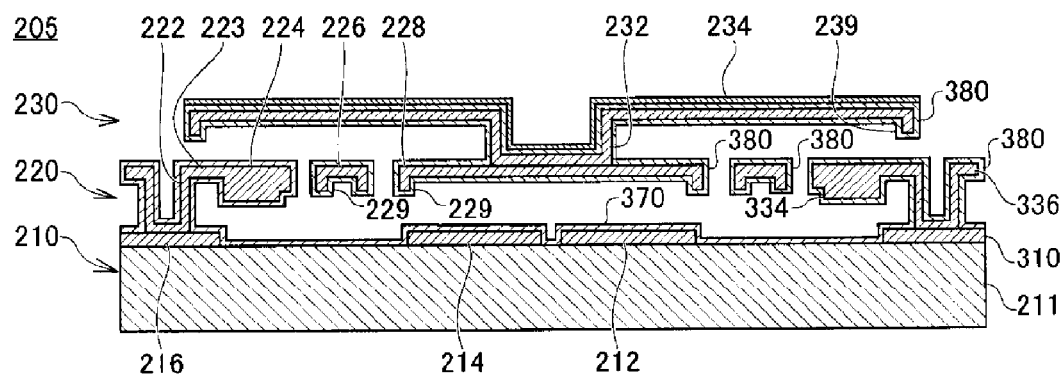
FIG. 33 is a cross-sectional view of the spatial light modulation element 205.

FIG. 33 is a cross-sectional view of a spatial light modulation element 205 having a different configuration. In FIG. 33, reference numerals in the 200s are given to components that are the same as in the spatial light modulation element 200 of FIG. 1. Furthermore, reference numerals in the 300s are given to components that correspond to the components in the manufacturing process shown in FIGS. 15 to 32.

As shown in FIG. 33, the spatial light modulation element 205 includes the circuit portion 210, the support section 220, and the reflecting portion in the same manner as the spatial light modulation element 200. However, each component of the spatial light modulation element 205 has a conductive layer 310 and a layered structure including metal layers 336 and 350, and a insulating layer 370 or compound layer 380. In this way, the conductive layer 310 and the metal layers 336 and 350 can be formed of a material that is lightweight and easily handled, such as aluminum or copper.

Furthermore, the surfaces of the conductive layer 310 and the metal layers 336 and 350 is covered by the compound layer 380 or the insulating layer 370, which are chemically stable, and therefore have high endurance. Since the front and back surface of the metal layers 336 and 350 are covered by the compound layer 380, the support section 220 and the reflecting portion 230 can prevent change caused by the bimetal effect of the metal and compounds. The material for the insulating layer 370 and the compound layer 380 can be selected from a wide group including oxides, nitrides, or carbides of the substrate material, for example.

Figure 34:
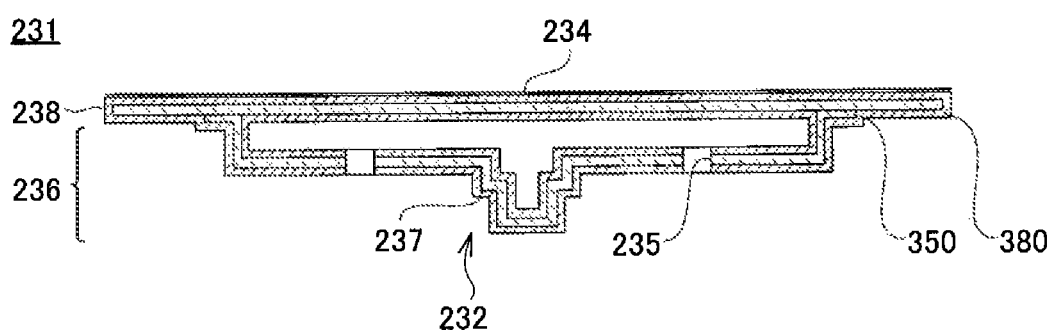
FIG. 34 is a cross-sectional view of the reflecting portion 231.

FIG. 34 is a cross-sectional view of a lone reflecting portion 231 having a different configuration. The reflecting portion 231 includes a stereoscopic structure 236 and a flat portion 238. The top portion of the stereoscopic structure 236 has a stereoscopic box shape. The upper post 232 has a fold portion 237 up to a midpoint thereof. As a result, the stereoscopic structure 236 has high strength.

The flat portion 238 formed on the stereoscopic structure 236 has absolutely no corrugation such as depressions, and is completely flat over the entire surface. Accordingly, by forming the reflective layer 360 on the top surface of the flat portion 238, the entire top surface of the reflecting portion 231 can be used as a flat reflecting mirror 234. Accordingly, the reflectance of the spatial light modulation element 200 can be improved.

The flat portion 238 is supported by the stereoscopic structure 236 having high strength, and therefore does not deform. Since the stereoscopic structure 236 is hollow, the overall weight of the reflecting portion 231 is not increased. By providing a drain 235 on the bottom surface during formation of the stereoscopic structure 236, the sacrificial layer serving as the base when forming the flat portion 238 can be removed.

Figure 35:
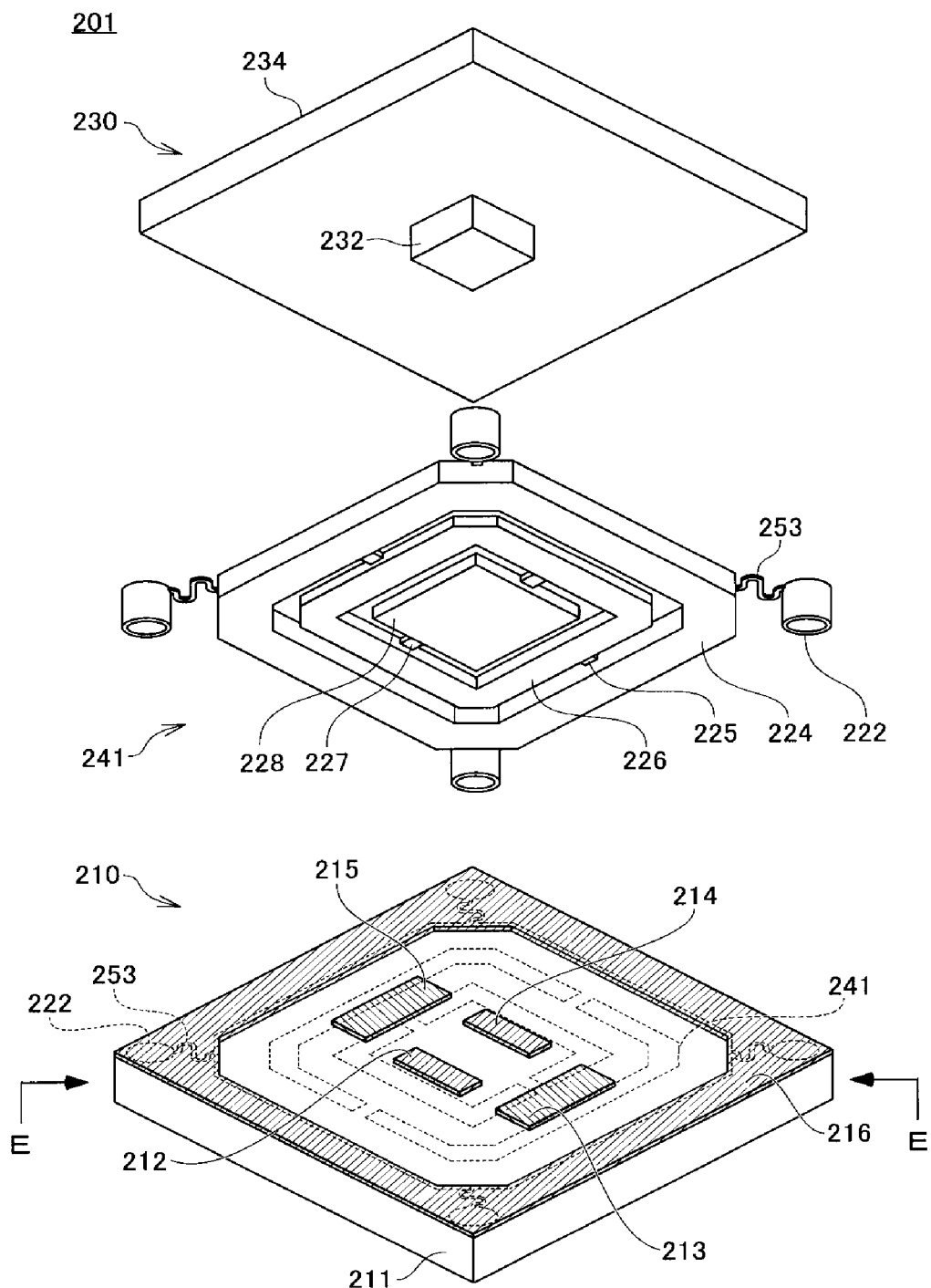
FIG. 35 is a schematic perspective view of the spatial light modulation element 201.

FIG. 35 is a schematic blown-up perspective view of a spatial light modulation element 201 including the support section 241 shown in FIG. 10. The spatial light modulation element 201 has the same configuration as the spatial light modulation element 200 of FIG. 1, aside from the portions described below. Accordingly, components that are the same as those of the spatial light modulation element 200 shown in FIG. 1 are given the same reference numerals, and redundant descriptions are omitted.

The spatial light modulation element 201 differs from the spatial light modulation element 200 in that the base frame 224 of the support section 241 is supported from the lower posts 222 by curved flexures 253. Therefore, as described above, the mechanical effect between the base frame 224 and the substrate 211 side including the lower posts 222 is effectively stopped, and the temperature characteristics of the spatial light modulation element 201 are stabilized.

In the spatial light modulation element 201, the ribs 229 and 239 of the base frame 224, the pivoting frame 226, the pivoting board 228, and the reflecting portion 230 are removed, thereby realizing greater strength relative to the thickness. As a result, the thickness of the base frame 224, the pivoting frame 226, the pivoting board 228, and the reflecting portion 230 becomes uniform, and the manufacturing process can be simplified in the manner described below.

FIGS. 36 to 47 each show a cross section for each step in a process for manufacturing the spatial light modulation element 201 shown in FIG. 35. FIGS. 36 to 47 each show the cross section indicated by the arrows E in FIG. 35. FIGS. 37 to 42 show the steps of forming the support section 241, and FIGS. 43 to 47 show the steps of forming the reflecting portion 230.

In FIGS. 35 to 47, there are cases where components in the spatial light modulation element 201 are included with a different shape or state. Therefore, in FIGS. 35 to 47, each component is given a unique reference numeral, and the relationship to the components on the spatial light modulation element 201 is described separately.

Figure 36:
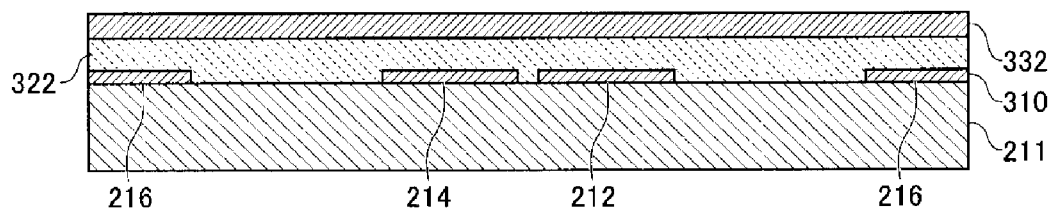
FIG. 36 is a cross-sectional view of a step in the process for manufacturing the spatial light modulation element 201.

FIG. 36 shows a stage at which the electrodes 214 and 216 are formed on the surface of the substrate 211 and then made flat by the sacrificial layer 322, after which the metal layer 332 is deposited over the entire surface of the sacrificial layer 322. The steps up to this point are the same as the steps for manufacturing the spatial light modulation element 200 shown in FIGS. 15 to 17. A TiAl alloy is used for the metal layer 332 and silicon oxide is used for the sacrificial layer 322.

Figure 37:
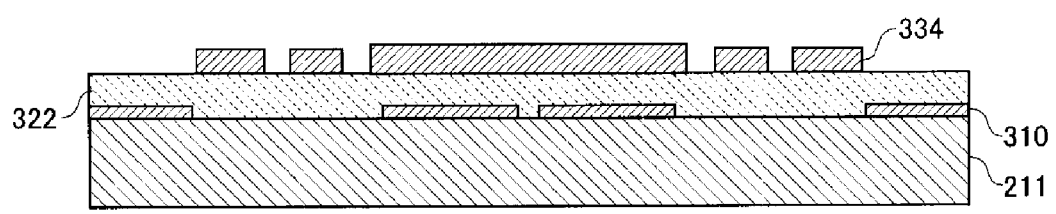
FIG. 37 is a cross-sectional view of a step following the step of FIG. 36 in the process for manufacturing the spatial light modulation element 201.

Next, as shown in FIG. 37, the metal layer 332 is patterned using dry etching or the like. As a result, the metal pattern 334 forming a portion of the base frame 224, the pivoting frame 226, and the pivoting board 228 in the spatial light modulation element 201 is formed.

Figure 38:
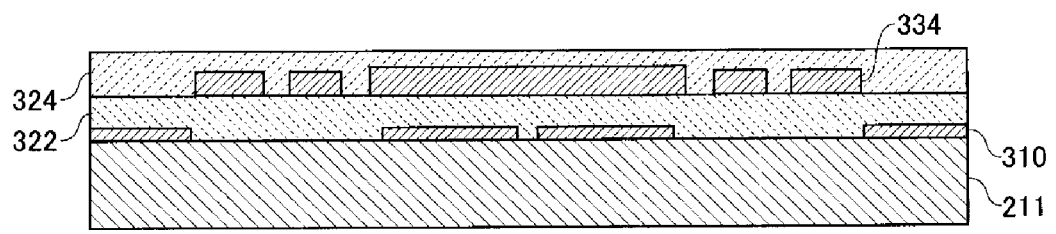
FIG. 38 is a cross-sectional view of a step following the step of FIG. 37 in the process for manufacturing the spatial light modulation element 201.
Figure 39:
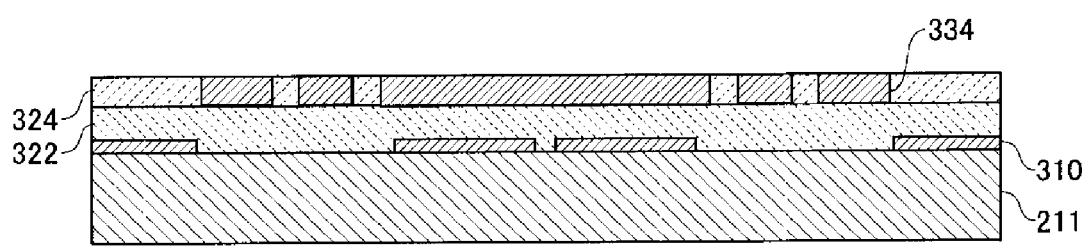
FIG. 39 is a cross-sectional view of a step following the step of FIG. 38 in the process for manufacturing the spatial light modulation element 201.

Next, as shown in FIG. 38, a new sacrificial layer 324 is deposited on the existing sacrificial layer 322 and the metal pattern 334, and the entire surface is made flat. Next, as shown in FIG. 39, a portion of the surface of the sacrificial layer 324 in the thickness direction is removed using the HF vapor technique, thereby exposing the metal pattern 334. As a result, a flat surface is formed on the substrate 211 by the metal pattern 334 or the sacrificial layer 324.

Figure 40:
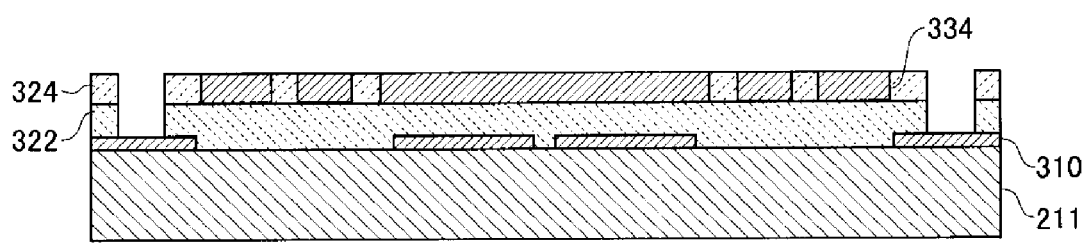
FIG. 40 is a cross-sectional view of a step following the step of FIG. 39 in the process for manufacturing the spatial light modulation element 201.

Next, as shown in FIG. 40, the two sacrificial layers 324 and 326 are patterned together, thereby forming the contact hole 321. The contact hole 321 is formed by dry etching, for example, and reaches the conductive layer 310 directly on the substrate 211. In this way, the deposition base with a stereoscopic shape is formed on the substrate 211.

Figure 41:
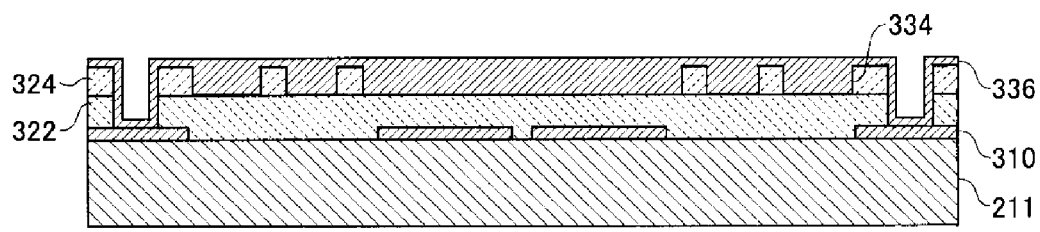
FIG. 41 is a cross-sectional view of a step following the step of FIG. 40 in the process for manufacturing the spatial light modulation element 201.

Next, as shown in FIG. 41, the metal layer 336 is deposited over the entire surface of the sacrificial layer 324 and metal pattern 334. A portion of the deposited metal layer 336 is formed integrally with the metal pattern 334 and has a different thickness. The metal layer 336 can be formed of a TiAl alloy, for example, and the deposition method can be selected from among physical vapor deposition, chemical vapor deposition, gold impregnation, or the like.

Figure 42:
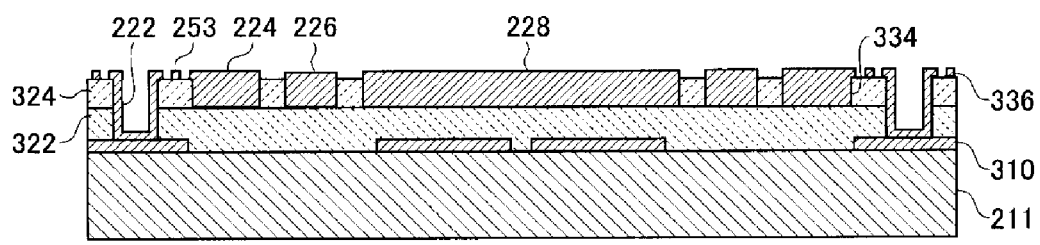
FIG. 42 is a cross-sectional view of a step following the step of FIG. 41 in the process for manufacturing the spatial light modulation element 201.

Next, as shown in FIG. 42, the metal layer 336 is patterned through dry etching or the like, thereby forming each component of the support section 241. As shown by the reference numerals in the 200s in FIG. 42, the lower post 222, the flexure 253, the base frame 224, the pivoting frame 226, and the pivoting board 228 are each formed by the metal layer 336. Furthermore, although not shown in the cross section of FIG. 42, the torsion shafts 225 and 227 between the base frame 224, the pivoting frame 226, and the pivoting board 228 are also formed.

The metal layer 336 is formed integrally with the metal pattern 334, and therefore among the elements of the support section 241, the base frame 224, the pivoting frame 226, and the pivoting board 228 are thicker than the flexure 253 and the torsion shafts 225 and 227. Accordingly, the base frame 224, the pivoting frame 226, and the pivoting board 228 have high strength. In this way, the portion corresponding to the support section 241 is formed.

Figure 43:
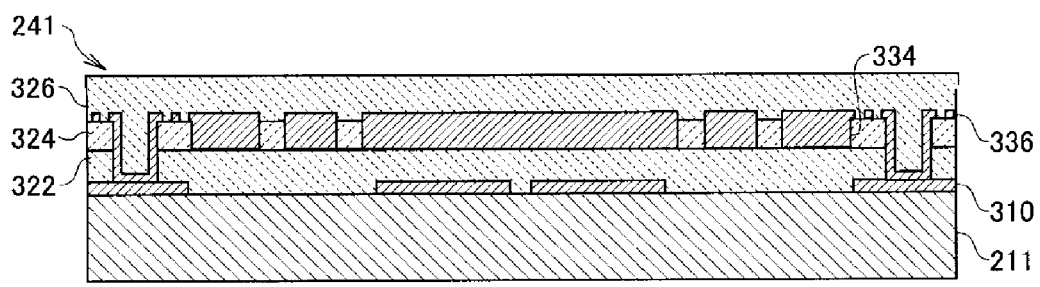
FIG. 43 is a cross-sectional view of a step following the step of FIG. 42 in the process for manufacturing the spatial light modulation element 201.
Figure 44:
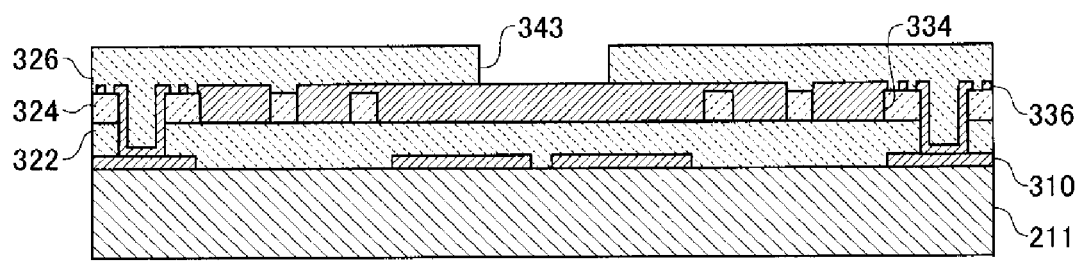
FIG. 44 is a cross-sectional view of a step following the step of FIG. 43 in the process for manufacturing the spatial light modulation element 201.

Next, as shown in FIG. 43, a new sacrificial layer 326 is deposited on the entire surface of the substrate 211, thereby flattening this surface. Furthermore, as shown in FIG. 44, a portion of the sacrificial layer 326 is removed to form the hole pattern 343 reaching to the metal layer 336.

Figure 45:
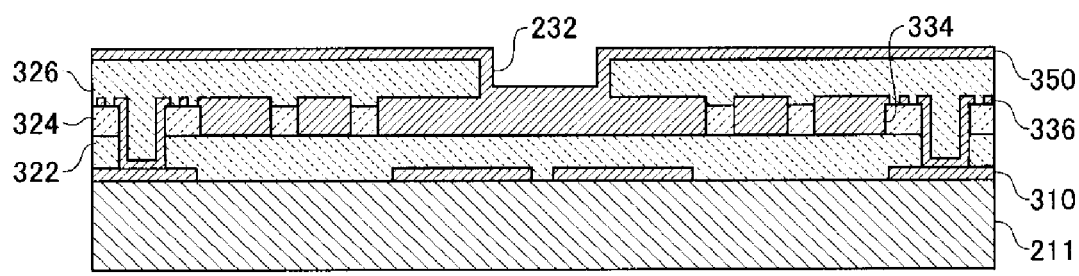
FIG. 45 is a cross-sectional view of a step following the step of FIG. 44 in the process for manufacturing the spatial light modulation element 201.

Next, as shown in FIG. 45, the metal layer 350 is deposited over the entire surface of the sacrificial layer 326 and the metal layer 336. The metal layer 350 can be formed by a TiAl alloy, for example. The deposition method can be selected from among physical vapor deposition, chemical vapor deposition, gold impregnation, or the like.

Figure 46:
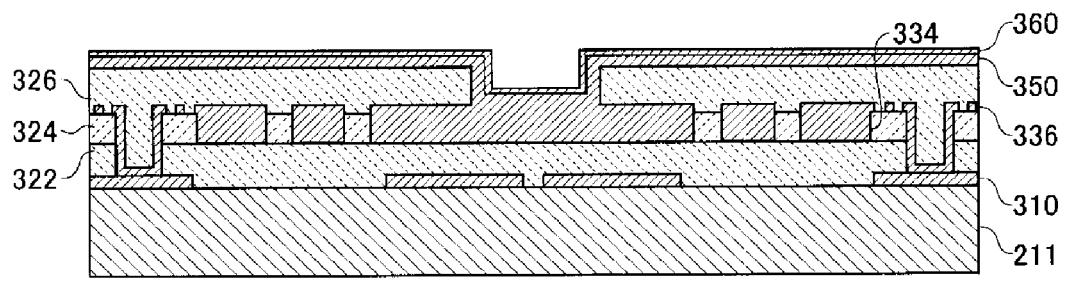
FIG. 46 is a cross-sectional view of a step following the step of FIG. 45 in the process for manufacturing the spatial light modulation element 201.

Next, as shown in FIG. 46, the reflective layer 360 is deposited on the metal layer 350. The reflective layer 360 is formed of a material with high reflectance, such as aluminum thin film.

Figure 47:
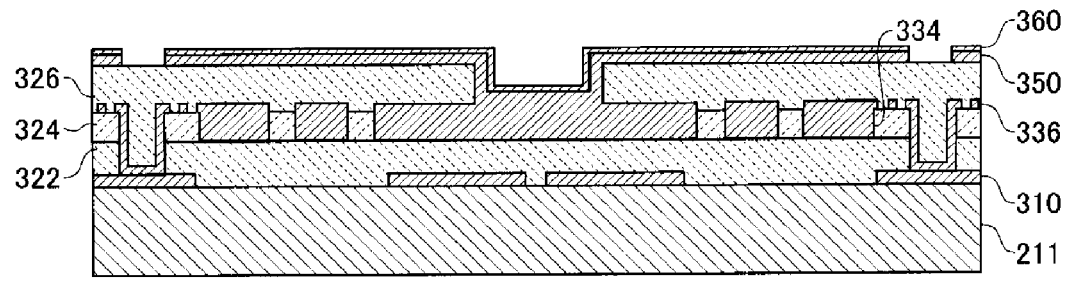
FIG. 47 is a cross-sectional view of a step following the step of FIG. 46 in the process for manufacturing the spatial light modulation element 201.

Next, as shown in FIG. 47, the side portions of the metal layer 350 and reflective layer 360 in FIG. 47 are trimmed. As a result, the continuous metal layer 350 and reflective layer 360 are separated at each spatial light modulation element 201, thereby forming the reflecting portions 230 that are independent in each element.

Figure 48:
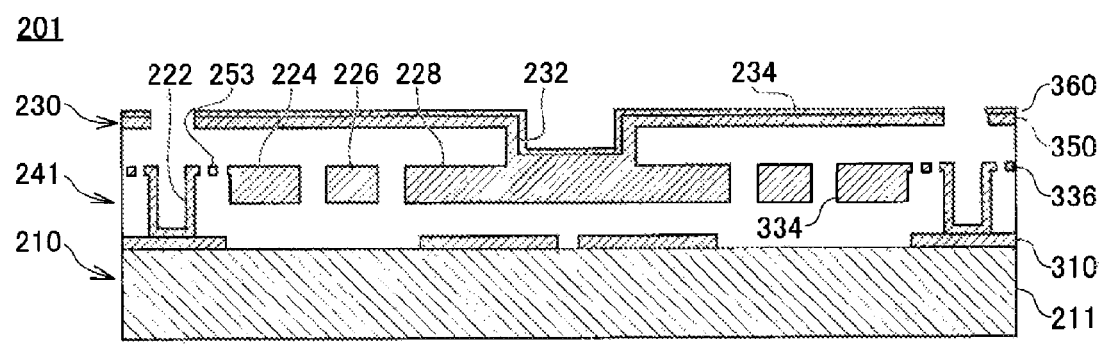
FIG. 48 is a cross-sectional view of a step following the step of FIG. 47 in the process for manufacturing the spatial light modulation element 201.

Finally, as shown in FIG. 48, the sacrificial layers 322, 324, and 326 are removed en bloc. Since the sacrificial layer 324 is formed in a continuous manner, the sacrificial layer 324 can be removed all at once through the HF vapor technique. In this way, the spatial light modulation element 201 is completed.

Specifically, the electrodes 212, 214, and 216 are formed by the conductive layer 310 on the surface of the substrate 211, thereby forming the circuit portion 210. The metal pattern 334 and the metal layer 336 form the support section 241. In the support section 241, the flexure 253 and the torsion shafts 225 and 227 are thin, while the base frame 224 is thick.

Furthermore, the reflecting portion 230 is connected to the pivoting board 228 by the upper post 232. The reflecting portion 230 has the reflecting mirror 234 with high reflectance formed by the reflective layer 360. The above example describes the manufacturing process focusing on a single spatial light modulation element 200, but the spatial light modulator 100 can also be manufactured by forming a plurality of the spatial light modulation elements 200 on a single substrate 211 en bloc.

The configurations and manufacturing processes described above are merely examples, and other configurations, processes, or materials can also be used to manufacture the spatial light modulation element 201. Specifically, one or all of the base frame 224, the pivoting frame 226, the pivoting board 228, and the reflecting mirror 234 may be provided with a portion having a looped shape, box shape, or the like to increase their strength. Furthermore, the spatial light modulation element 201 may be formed by composite materials formed by alternately layering metal layers and layers of oxides, nitride, carbides, or the like.

Figure 49:
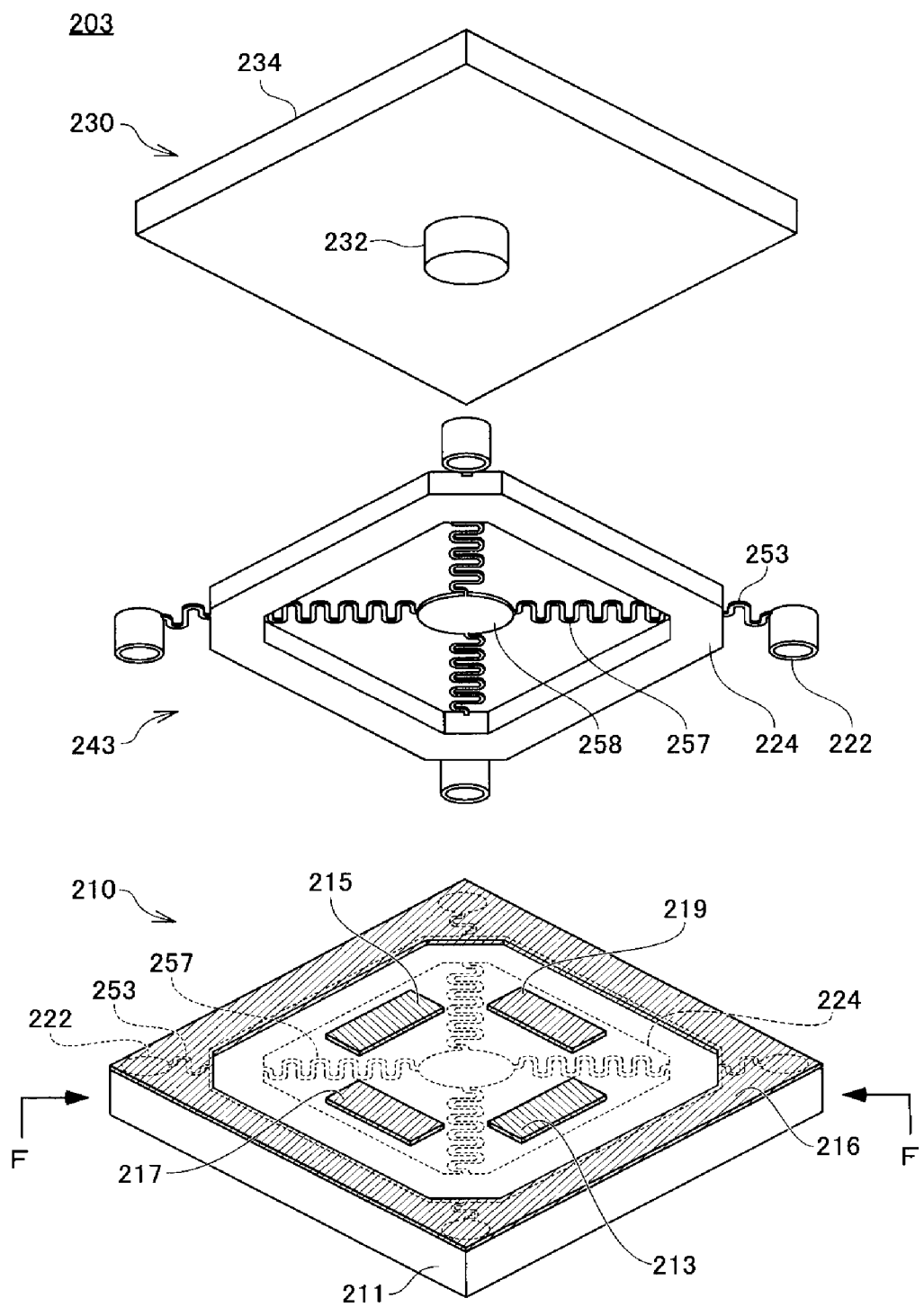
FIG. 49 is a schematic perspective view of the spatial light modulation element 203.

FIG. 49 is a schematic exploded perspective view of a spatial light modulation element 203 including the support section 243 shown in FIG. 12. The spatial light modulation element 203 has the same configuration as the spatial light modulation element 200 of Claim 1, aside from the portions described below. Accordingly, components that are the same as those of the spatial light modulation element 200 shown in FIG. 1 are given the same reference numerals, and redundant descriptions are omitted.

The spatial light modulation element 203 differs from the spatial light modulation element 200 in that the base frame 224 of the support section 243 is supported from the lower posts 222 by curved flexures 253. Therefore, as described above, the mechanical effect between the base frame 224 and the substrate 211 side including the lower posts 222 is effectively stopped, and the temperature characteristics of the spatial light modulation element 201 are stabilized.

Furthermore, in the spatial light modulation element 203, the pivoting frame 226 is removed, and the pivoting board 258 is supported directly from the base frame 224 by the long flexures 257. The base frame 224 has greater thickness than other portions of the support section 243, and therefore has relatively high strength.

The pivoting board 258 has the same thickness as the long flexure 257, and has substantially the same shape as the bottom end of the upper post 232 of the reflecting portion 230. As a result, the pivoting board 258 is much smaller and more lightweight than the pivoting board 228.

Each long flexure 257 is shaped as a repeating curve, in the same manner as the flexures 253 that support the base frame 224 from the outside, and is oriented to extend diagonally from an inside corner of the base frame 224 to the pivoting board 258. As described above, since the long flexures 257 have low surface area, the pivoting board 258 cannot pivot as a result of electrostatic force acting on the long flexures 257.

Therefore, in the spatial light modulation element 203, the reflecting mirror 234 pivots as a result of being acted on by the electrostatic force between the reflecting mirror 234 of the reflecting portion 230 and the electrodes 213, 215, 217, and 219 on the substrate 211. Therefore, the electrodes 213, 215, 217, and 219 are arranged at positions to avoid the long flexures 257.

FIGS. 50 to 62 each show a cross section for each step in a process for manufacturing the spatial light modulation element 203 shown in FIG. 49. FIGS. 50 to 62 each show the cross section indicated by the arrows F in FIG. 49. FIGS. 50 to 56 show the steps of forming the support section 243, and FIGS. 57 to 62 show the steps of forming the reflecting portion 230.

In FIGS. 50 to 62, there are cases where components in the spatial light modulation element 203 are included with a different shape or state. Therefore, in FIGS. 50 to 62, each component is given a unique reference numeral, and the relationship to the components on the spatial light modulation element 203 is described separately.

Figure 50:
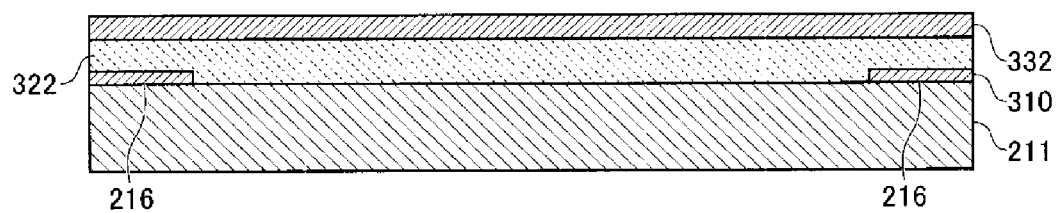
FIG. 50 is a cross-sectional view of a step in the process for manufacturing the spatial light modulation element 203.

FIG. 50 shows a stage at which the electrode 216 is formed on the surface of the substrate 211 and is then flattened by the sacrificial layer 322, after which the metal layer 332 is deposited over the entire surface of the sacrificial layer 322. The steps up to this point are the same as the steps for manufacturing the spatial light modulation element 200 shown in FIGS. 10 to 17.

The electrodes 213, 215, 217, and 219 are formed on the substrate 211 at the same time as the electrode 216, but do not appear in the cross section. A TiAl alloy is used for the metal layer 332, and silicon oxide is used for the sacrificial layer 322.

Figure 51:
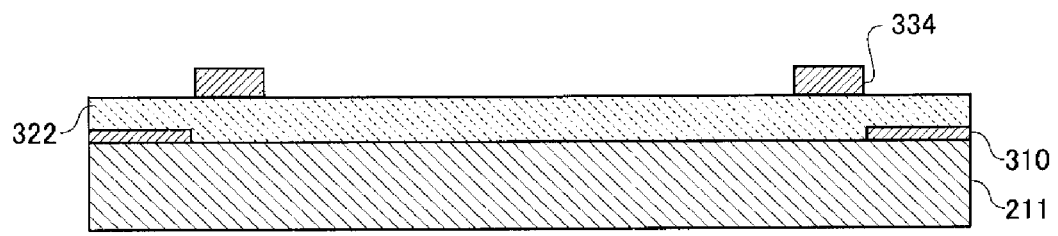
FIG. 51 is a cross-sectional view of a step following the step of FIG. 50 in the process for manufacturing the spatial light modulation element 203.

Next, as shown in FIG. 51, the metal layer 332 is patterned using dry etching or the like. As a result, the metal pattern 334 forming a portion of the base frame 224 in the spatial light modulation element 203 is formed.

Figure 52:
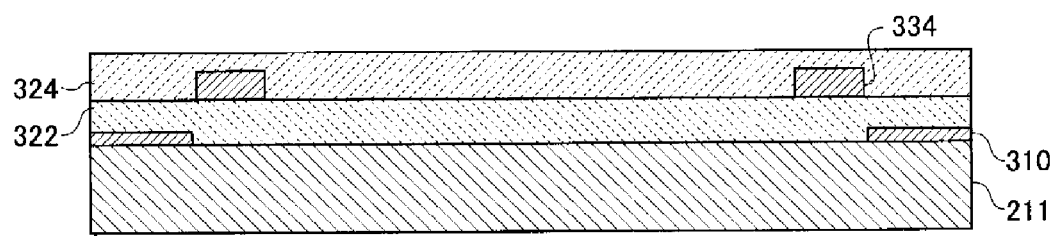
FIG. 52 is a cross-sectional view of a step following the step of FIG. 51 in the process for manufacturing the spatial light modulation element 203.
Figure 53:
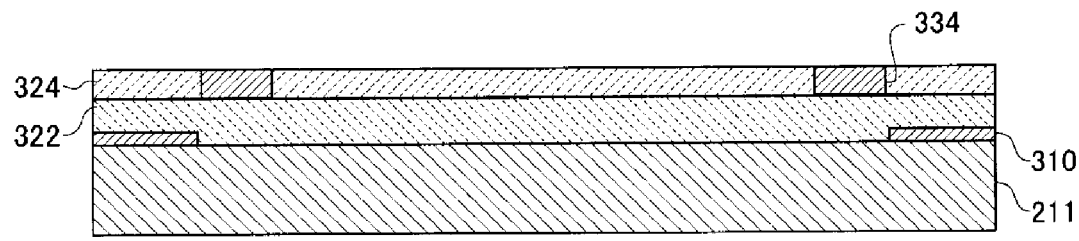
FIG. 53 is a cross-sectional view of a step following the step of FIG. 52 in the process for manufacturing the spatial light modulation element 203.

Next, as shown in FIG. 52, a new sacrificial layer 324 is deposited on the existing sacrificial layer 322 and the metal pattern 334, thereby burying the metal pattern 334. Next, as shown in FIG. 53, a portion of the surface of the sacrificial layer 324 in the thickness direction is removed using the HF vapor technique, thereby exposing the metal pattern 334. As a result, a flat surface is formed on the substrate 211 by the metal pattern 334 or the sacrificial layer 324.

Figure 54:
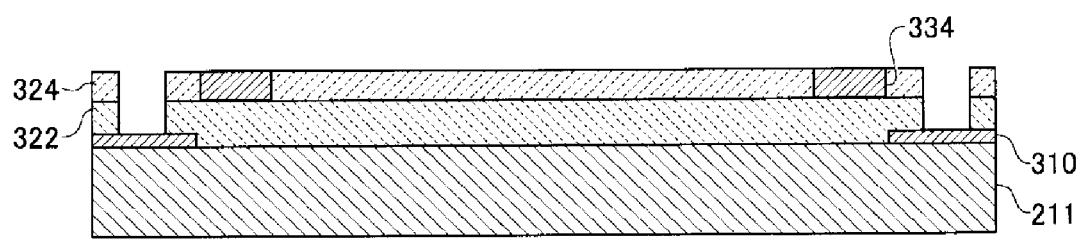
FIG. 54 is a cross-sectional view of a step following the step of FIG. 53 in the process for manufacturing the spatial light modulation element 203.

Next, as shown in FIG. 54, the two sacrificial layers 324 and 326 are patterned together, thereby forming the contact hole 321. The contact hole 321 is formed by dry etching, for example, and reaches the conductive layer 310 directly on the substrate 211. In this way, the deposition base with a stereoscopic shape is formed on the substrate 211.

Figure 55:
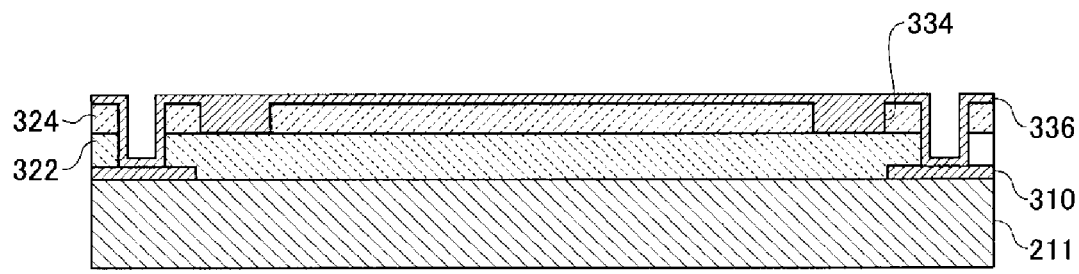
FIG. 55 is a cross-sectional view of a step following the step of FIG. 54 in the process for manufacturing the spatial light modulation element 203.

Next, as shown in FIG. 55, the metal layer 336 is deposited over the entire surface of the sacrificial layer 324 and metal pattern 334. A portion of the metal layer 336 is formed integrally with the metal pattern 334 and has a different thickness. The metal layer 336 can be formed of a TiAl alloy, for example, and the deposition method can be selected from among physical vapor deposition, chemical vapor deposition, gold impregnation, or the like.

Figure 56:
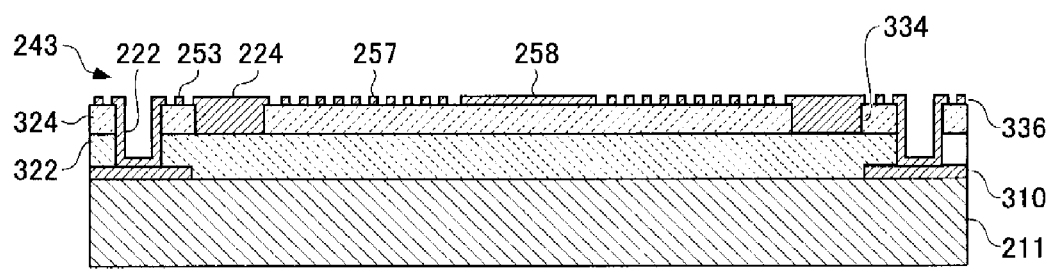
FIG. 56 is a cross-sectional view of a step following the step of FIG. 55 in the process for manufacturing the spatial light modulation element 203.

Next, as shown in FIG. 56, the metal layer 336 is patterned through dry etching or the like, thereby forming each component of the support section 243. As shown by the reference numerals in the 200s in FIG. 56, the lower post 222, the flexure 253, the base frame 224, the long flexure 257, and the pivoting board 258 are each formed by the metal layer 336.

The metal layer 336 is formed integrally with the metal pattern 334, and therefore the base frame 224 is thicker than the flexure 253, the long flexure 257, and the pivoting board 258. Accordingly, the base frame 224 has high strength. In this way, the portion corresponding to the support section 243 is formed on the substrate 211.

Figure 57:
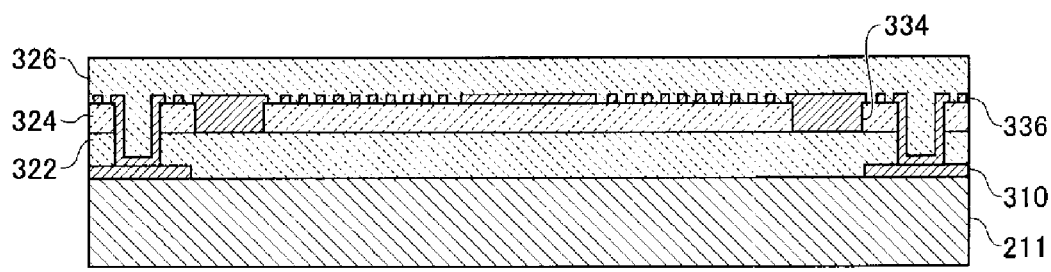
FIG. 57 is a cross-sectional view of a step following the step of FIG. 56 in the process for manufacturing the spatial light modulation element 203.
Figure 58:
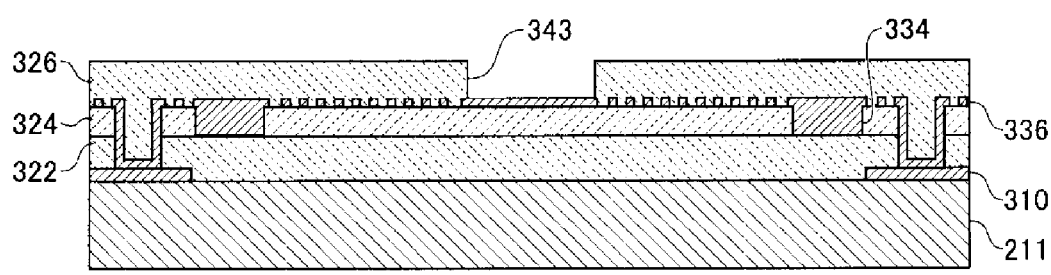
FIG. 58 is a cross-sectional view of a step following the step of FIG. 57 in the process for manufacturing the spatial light modulation element 203.

Next, as shown in FIG. 57, a new sacrificial layer 326 is deposited on the entire surface of the substrate 211, thereby flattening this surface. Furthermore, as shown in FIG. 58, a portion of the sacrificial layer 326 is removed to form the hole pattern 343 reaching to the surface of the metal layer 336.

Figure 59:
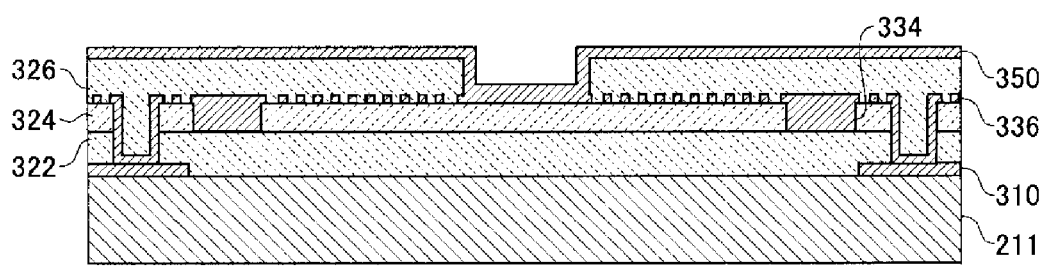
FIG. 59 is a cross-sectional view of a step following the step of FIG. 58 in the process for manufacturing the spatial light modulation element 203.

Next, as shown in FIG. 59, the metal layer 350 is deposited over the entire surface of the sacrificial layer 326 and the metal layer 336. The metal layer 350 can be formed by a TiAl alloy, for example. The deposition method can be selected from among physical vapor deposition, chemical vapor deposition, gold impregnation, or the like.

Figure 60:
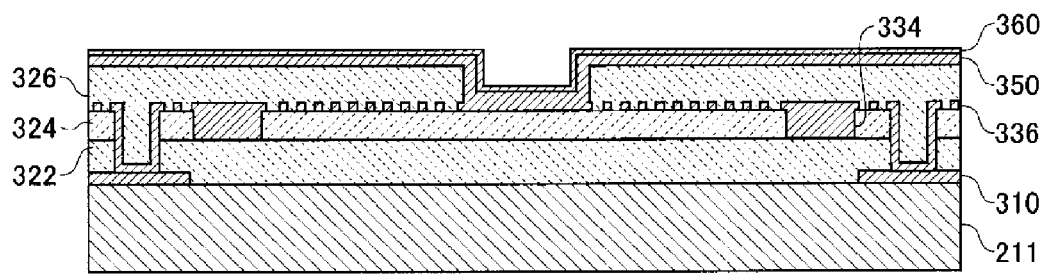
FIG. 60 is a cross-sectional view of a step following the step of FIG. 59 in the process for manufacturing the spatial light modulation element 203.

Next, as shown in FIG. 60, the reflective layer 360 is deposited on the metal layer 350. The reflective layer 360 is formed of a material with high reflectance, such as aluminum thin film.

Figure 61:
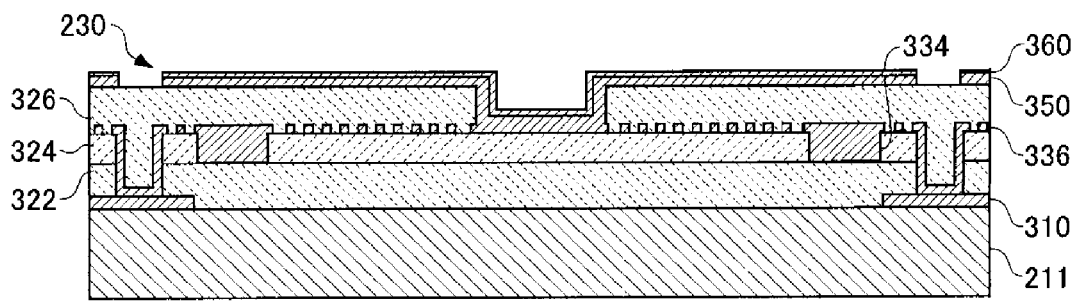
FIG. 61 is a cross-sectional view of a step following the step of FIG. 60 in the process for manufacturing the spatial light modulation element 203.

Next, as shown in FIG. 61, the side portions of the metal layer 350 and reflective layer 360 in FIG. 61 are trimmed. As a result, the continuous metal layer 350 and reflective layer 360 are separated at each spatial light modulation element 203, thereby forming the reflecting portions 230 that are independent in each element.

Figure 62:
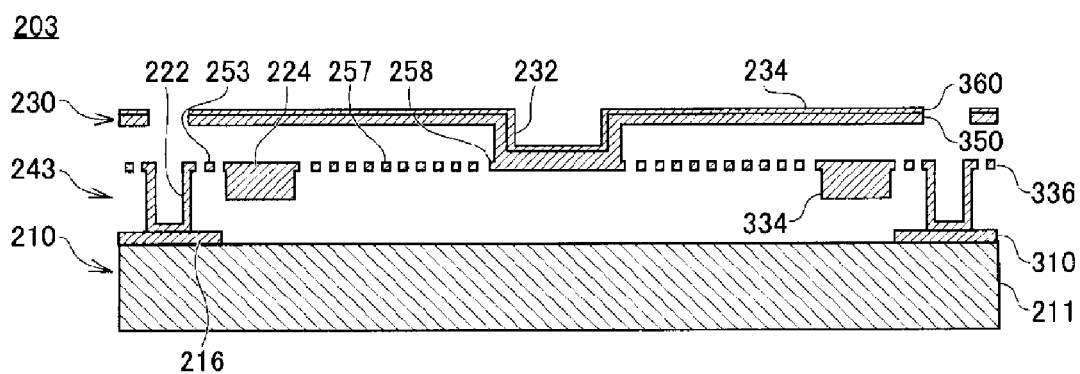
FIG. 62 is a cross-sectional view of a step following the step of FIG. 61 in the process for manufacturing the spatial light modulation element 203.

Finally, as shown in FIG. 62, the sacrificial layers 322, 324, and 326 are removed en bloc. Since the sacrificial layer 324 is formed in a continuous manner, the sacrificial layer 324 can be removed all at once through the HF vapor technique. In this way, the spatial light modulation element 203 is completed.

Specifically, the electrode 216 is formed by the conductive layer 310 on the surface of the substrate 211, thereby forming the circuit portion 210. The metal pattern 334 and the metal layer 336 form the support section 243. In the support section 243, the flexure 253 and the long flexure 257 are thin, while the base frame 224 is thick.

Furthermore, the reflecting portion 230 is connected to the pivoting board 258 by the upper post 232. The reflecting portion 230 has the reflecting mirror 234 with high reflectance formed by the reflective layer 360. The above example describes the manufacturing process focusing on a single spatial light modulation element 200, but the spatial light modulator 100 can also be manufactured by forming a plurality of the spatial light modulation elements 200 on a single substrate 211 en bloc.

The configurations and manufacturing processes described above are merely examples, and other configurations, processes, or materials can also be used to manufacture the spatial light modulation element 203. Specifically, the base frame 224 and the reflecting mirror 234 may be provided with a portion having a looped shape, box shape, or the like to increase their strength. Furthermore, the spatial light modulation element 203 may be formed by composite materials formed by alternately layering metal layers and layers of oxides, nitride, carbides, or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A spatial light modulation element comprising:
   a substrate;
   a reflecting mirror that moves from an initial position relative to the substrate;
   an elastic member that exerts an elastic force in a direction causing the reflecting mirror to return to the original position;
   a support body that supports the elastic member, the support body including a rib that protrudes toward the substrate from at least one side of the support body; and
   an elastic support member that elastically supports the support body relative to the substrate.

2. The spatial light modulation element of claim 1, wherein the support body is supported at a distance from a surface of the substrate.

3. The spatial light modulation element according to claim 1, further comprising a connecting portion that connects the support body to the substrate such that the support body can move along a surface direction of the substrate.

4. The spatial light modulation element according to claim 1, wherein the support body is formed of a material that is the same as a material of the elastic member, and has higher bend strength than the elastic member.

5. The spatial light modulation element according to claim 1, wherein the elastic member includes a pair of elastic bodies that have the same bend strength as each other.

6. The spatial light modulation element according to claim 1, wherein the elastic member includes two pairs of elastic bodies that are arranged in directions orthogonal to each other.

7. The spatial light modulation element according to claim 1, wherein the elastic support member has higher bend strength than the elastic member.

8. A spatial light modulator comprising a plurality of the spatial light modulation elements according to claim 1.

9. An exposure apparatus comprising the spatial light modulator according to claim 8.

* * * * *